(12) United States Patent
Chen et al.

(10) Patent No.: US 8,934,540 B2
(45) Date of Patent: Jan. 13, 2015

(54) VIDEO COMPRESSION USING MULTIPLE VARIABLE LENGTH CODING METHODS FOR MULTIPLE TYPES OF TRANSFORM COEFFICIENT BLOCKS

(75) Inventors: Wen-hsiung Chen, Sunnyvale, CA (US); Yian Xu, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 736 days.

(21) Appl. No.: 12/840,080

(22) Filed: Jul. 20, 2010

(65) Prior Publication Data

US 2012/0020408 A1 Jan. 26, 2012

(51) Int. Cl.
*H04N 7/30* (2006.01)
*H03M 7/40* (2006.01)
*H04N 19/176* (2014.01)
*H04N 19/134* (2014.01)
*H04N 19/46* (2014.01)
*H04N 19/13* (2014.01)

(52) U.S. Cl.
CPC ............ *H03M 7/40* (2013.01); *H04N 19/00278* (2013.01); *H04N 19/00133* (2013.01); *H04N 19/00545* (2013.01); *H04N 19/00121* (2013.01)
USPC ................................. 375/240.03; 375/240.02

(58) Field of Classification Search
None
See application file for complete search history.

(56) References Cited

U.S. PATENT DOCUMENTS

| | | | |
|---|---|---|---|
| 4,698,672 A | 10/1987 | Chen et al. | |
| 7,194,137 B2 | 3/2007 | Chen et al. | |
| 7,212,681 B1 | 5/2007 | Chen et al | |
| 7,454,076 B2 | 11/2008 | Chen et al. | |
| 7,471,840 B2 | 12/2008 | Toebes et al. | |
| 7,483,584 B2 | 1/2009 | Chen et al. | |
| 7,492,956 B2 | 2/2009 | Chen et al. | |
| 7,499,595 B2 | 3/2009 | Chen et al. | |
| 7,499,596 B2 | 3/2009 | Chen et al. | |
| 7,620,258 B2 | 11/2009 | Chen et al. | |
| 7,680,349 B2 | 3/2010 | Chen et al. | |
| 2005/0276498 A1* | 12/2005 | Chen et al. | 382/245 |
| 2006/0039615 A1* | 2/2006 | Chen et al. | 382/232 |
| 2009/0016440 A1 | 1/2009 | Tian et al. | |
| 2009/0086815 A1* | 4/2009 | Tian et al. | 375/240.03 |
| 2009/0087113 A1* | 4/2009 | Li et al. | 382/246 |
| 2009/0154820 A1* | 6/2009 | Li et al. | 382/246 |

OTHER PUBLICATIONS

Karczewicz et al., "Video Coding Technology Proposal by Qualcomm Inc", 1. JCT-VC Meeting; Apr. 15, 2010-Apr. 23, 2010; Dresden; (Joint Collaborative Team on Video Coding of ISO/IEC JTC1/SC29/WG11 and ITU-T SG.16 ); May 18, 2010.*
Wien et al., "Adaptive Block Transforms (ABT)", ITU Study Group 16—Video Coding Experts Group—ISO/IEC MPE!G & ITU-T VCEG(ISO/IEC JTC1/SC29/WG11 and ITU-T SG16 Q6), No. VCEG-M62, Mar. 28, 2001, XP030003232.*
International Search Report and Written Opinion on PCT Application PCT/US2011/043906 mailed Aug. 22, 2011.

(Continued)

*Primary Examiner* — Mehrdad Dastouri
*Assistant Examiner* — James Anderson, II

(57) ABSTRACT

Classifying a series of quantized transform coefficients of a block of image data into one of a pre-defined plurality of classes for entropy coding, and entropy coding the block. A class is defined by at least the size of the block and typically but not necessarily one or more other factors. The classified series is coded by one of a set of pre-defined entropy coding methods, e.g., variable length coding methods for the pre-defined classes.

24 Claims, 11 Drawing Sheets

(56) References Cited

OTHER PUBLICATIONS

Karczewicz, Marta et al: "Video coding technology proposal by Qualcomm Inc.", 1st Meeting of Joint Collaborative Team on Video Coding (JCT-VC), Dresden, DE, Apr. 15-23, 2010, Document No. JCTVC-A121.

Wien, Mathias et al: "Adaptive Block Transforms (ABT)", ITU—Telecommunications Standardization Sector Study Group 16 Question 6, Video Coding Experts Group (VCEG), Thirteenth Meeting: Austin, Texas, USA Apr. 2-4, 2001, Document No. VCEG-M62, Mar. 27, 2001.

S. Adachi et al: "CAVLC Cleanup to Accommodate ABT including Field Scans", Joint Video Team (JVT) of ISO/IEC MPEG & ITU-T VCEG (ISO/IEC JTC1/SC29/WG11 and ITU-T SG16 Q.6), 5th Meeting: Geneva, Switzerland, Oct 9-17, 2002, Document No. JVT-E120.

Junlin Li; AlRegib, G.; Dihong Tian; Pi Sheng Chang; Chen, W.H.: "Three-dimensional position and amplitude VLC coding in H.264/AVC", Proceedings, 15th IEEE International Conference on Image Processing, 2008. ICIP 2008., 2008, pp. 2488-2491.

Junlin Li; AlRegib, G.; Dihong Tian; Chen, W.H.; Pi Sheng Chang: "Context adaptive hybrid variable length coding in H.264/AVC", Proceedings, 16th IEEE International Conference on Image Processing. ICIP 2009, 2009, pp. 3437-3440.

Qiang Wang; Debin Zhao; Siwei Ma; Yan Lu; Qingming Huang; Wen Ga: "Context-based 2D-VLC for video coding" Proceedings, 2004 IEEE International Conference on Multimedia, 2004. ICME apos;04, vol. 1, Issue Jun. 27-30, 2004 pp. 89-92.

D. Marpe, H. Schwarz, and T. Wiegand, "Context-Based Adaptive Binary Arithmetic Coding in the H.264/AVC Video Compression Standard," IEEE Trans. Circuits Syst. Video Technol., vol. 13, pp. 620-636, Jul. 2003.

Dihong Tian; Chen, W.H.; Pi Sheng Chang; Al Regib, G.; Mersereau, R.M, "Hybrid Variable Length Coding for Image and Video Compression," Proceedings, IEEE International Conference on Acoustics, Speech and Signal Processing, 2007. ICASSP 2007, vol. 1, 2007, pp. I-1133-I-1136.

Dihong Tian Pi Sheng Chang Chen, W.H., "Hybrid Variable Length Coding in Video Compression using Variable Breakpoint," Proceedings of IEEE International Conference on Image Processing, 2007 (ICIP 2007), Sep. 16, 2007-Oct. 19, 2007, vol. 3, pp. III-413-III-416. as described in published US Application.

* cited by examiner

US 8,934,540 B2

VIDEO COMPRESSION USING MULTIPLE VARIABLE LENGTH CODING METHODS FOR MULTIPLE TYPES OF TRANSFORM COEFFICIENT BLOCKS

TECHNICAL FIELD

The present disclosure relates generally to image compression and in particular to entropy coding of series of quantized transform coefficients of blocks of image data.

BACKGROUND

Digital video compression ranges from coding still images to moving video for photographic, broadcasting, streaming, and conferencing applications. In traditional transform coding, pictures consisting of pixels are partitioned into blocks; each block of pixels is transformed; the transform coefficients are ordered and quantized; and some form of variable length coding (VLC, including arithmetic coding) is used to represent the series of quantized transform coefficients of each block. In many current standards, the blocks are of a fixed size, e.g., 8×8 for JPEG, MPEG1, MPEG2/H.262, MPEG4, H.261, and H.263. While some coding methods, e.g., the high profile of H.264/AVC, allow for two block sizes (4×4 and optionally 8×8) within the same picture, the VLC method for all blocks is the same for the one picture. In all of these standard coding methods, the VLC method is either two-dimensional variable length coding (2DVLC) or one of its many variations, such as Context-based Adaptive Binary Arithmetic Coding (CABAC), Context Adaptive Variable Length Coding (CAVLC) and Context-Based 2D Variable Length Coding (C2DVLC).

DESCRIPTION OF EXAMPLE EMBODIMENTS

Overview

Figure 1:
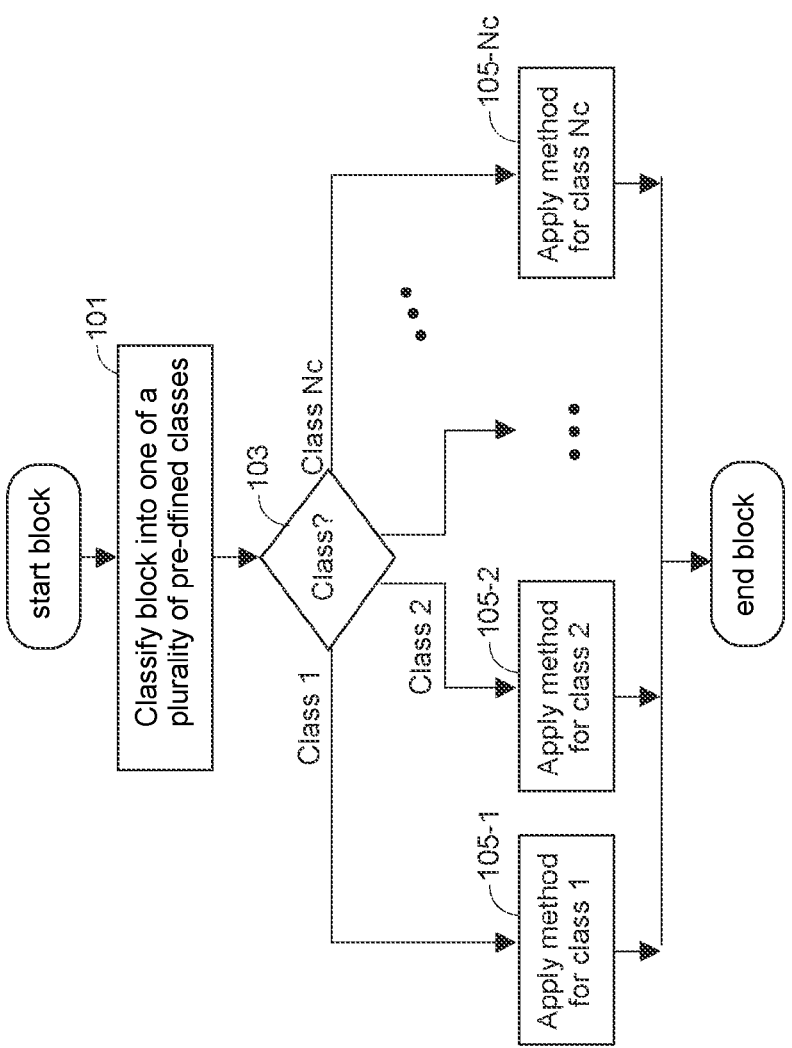
FIG. 1 shows a simplified flowchart in accordance with an embodiment of the present invention.

Embodiments of the present invention include a method, an apparatus, and logic encoded in one or more computer-readable tangible medium to carry out a method. The method is to encode blocks of quantized transform coefficients of blocks of a picture. The quantized transform coefficients are in an ordered series. The method includes classifying a series of quantized transform coefficients of a block of image data into one of a pre-defined plurality of classes. A class is defined by at least the size of the block and typically but not necessarily one or more other factors. The classified series is coded by one of a set of pre-defined entropy coding methods, e.g., variable length coding methods, a pre-defined entropy coding method being mapped to each class of the pre-defined plurality of classes. Thus, embodiments of the present invention use multiple types of entropy coding methods to code the quantized coefficient of various classes of transform blocks, a class being defined by at least the size of the block and typically one or more other factors. For at least two classes of ordered series of different block sizes, different entropy coding methods are applied to the different classes of blocks. In some embodiments described herein, the entropy coding methods include at least one variable length coding method.

Some abbreviations and description of some entropy coding methods

Embodiments of the present invention describe various entropy coding methods, in particular variable length coding methods applicable to entropy coding an ordered series of transform coefficients obtained by transforming a block of image data. The following defined abbreviations are used in some of the variable length coding methods of some embodiments of the present invention.

VLC: variable length coding.

RL: run level joint event of run length, possibly of 0 length of zeroes preceding a non-zero-amplitude coefficient and the coding thereof LF: low frequency, usually referring to the low frequency quantized coefficients in hybrid variable length coding in which an ordered sequence of quantized transform coefficients of a block of image data is partitioned by a breakpoint into a low frequency series of coefficients and a high frequency ordered series of coefficients.

1D: one-dimensional

2D: two-dimensional.

3D: three-dimensional.

AVS: Audio Video Coding Standard of China, published by the Audio Video Coding Standard Workgroup of China as Information Technology Advanced Audio and Video Coding Part 2: Video(AVS1-P2 JQP FCD 1.0), Audio Video Coding Standard Group of China (AVS), Doc. AVS-N1538, September 2008.

H.264/AVC: ITU-T Rec. H.264, part 10, now an international standard ISO/IEC 14496-10. Note that high profile of H.264/AVC allows for optimization at the macroblock level so that within the same picture, there may be with 4×4 transform blocks, and macroblocks with 8×8 transform blocks. The entropy coding for the ordered series of transform coefficients for the blocks in a picture is the same no matter whether a transform block is 4×4 or 8×8.

DIRAC: an open source video codec designed and published by the British Broadcasting Corporation (BBC).

VC-1: the informal name of the Society of Motion Picture Society of Motion Picture and Television Engineers (SMPTE) 421M video codec. Note that VC-1 includes a profile that allows for multiple transform block sizes within the same picture, e.g., 4×4, 4×8, 8×4, and 8×8 transform blocks. However, the entropy coding for the ordered series of transform coefficients for the blocks in a picture is the same independent of the size of the transform block.

HVLC: hybrid VLC. In HVLC, an ordered sequence of quantized transform coefficients of a block of image data is partitioned by a breakpoint into at least a low frequency series (a LF region) of coefficients and high frequency ordered series of coefficient (A HF region). One aspect of HVLC is the recognition that non-zero valued coefficients are likely to be clustered in the LF region, and are likely to be scattered or isolated in the HF region, so that different methods are appropriate for the LF and HF regions. Various methods have been developed for position and amplitude coding events in the regions.

HVLC2DP1DA: hybrid VLC with 2D position coding of events defined by two variables, e.g., the run length, possibly zero, of zero-valued preceding any cluster of non-zero coefficients, and the number of non-zero coefficients, and 1D amplitude coding of non-zero amplitudes in the cluster.

RL-VLC: run-level VLC that jointly codes run length of zero-valued quantized coefficients that precede a non-zero-valued quantized coefficient and the amplitude level of the non-zero-valued quantized coefficient.

2DVLC: two dimensional VLC, another name for RL-VLC.

CABAC: Context-based Adaptive Binary Arithmetic Coding, a variation of RL-VLC as described for H.264/AVC.

CAVLC: Context Adaptive Variable Length Coding, a variation of RL-VLC as described for H.264/AVC in which ordered quantized coefficients of a 4×4 block are coded in a reverse order using a one-dimensional position coding scheme to code the positions of non-zero coefficients.

C2DVLC: Context-based 2D variable length coding, a variation of RL-VLC as described for China's AVS (Audio Video Coding Standard of China.)

ICAVLC: Improved Context Adaptive Variable Length Coding, that includes encoding with 1D VLC one at a time the run-length of zeroes and the run-length of non-zero coefficients interchangeably, depending on the numbers of zeroes and non-zero coefficients remaining to be coded, and in an alternate implementation, encoding the positions of zero and non-zero coefficients concurrently by multi-dimensional VLC. ICAVLC can improve CAVLC, C2DVLC, and HVLC.

CAPAC: Context Adaptive Position and Amplitude Coding that in some versions includes a two-way position and amplitude coding process. Positions of clusters non-zero coefficients are ordered and coded by multiple VLC tables with adaptive table switching based on the context, i.e., by one or more items of information determinable from previously encoded information and useful in predicting behavior, e.g., information determined from previously coded coefficients. The non-zero amplitudes are coded in a reverse order from high to low frequency, and regrouped into sub-sequences according to their adjacency to zeroes. These sub-sequences are coded with different respective (multidimensional) VLC mappings that have different dimensionality.

HVLC3DPA: hybrid VLC with 3D coding of joint position and amplitude events and coding of the event. The 3DPA events are defined by the number of zero-valued coefficients preceding each cluster of non-zeroes, the run-length of each cluster, and a parameter that indicates the number of trailing coefficients of amplitude 1. Remaining amplitudes are coded separately by a one-dimensional VLC mapping.

CAHVLC: Context Adaptive Hybrid Variable Length Coding. Some embodiments include the coding of HVLC3DPA with the addition that multiple code tables are used for both 3DPA and 1DA coding and the code table is adaptively chosen based on the derivable context information from coded neighboring blocks or from the coded portion of the currently being coded block.

Rnz, Rnz≥1: the number of non-zero-amplitude quantized coefficients in a cluster of non-zero valued coefficients. In some methods, the cluster includes a single zero-valued quantized coefficient immediately following the cluster.

Rz, Rz≥0 the number of consecutive zero-valued coefficients immediately preceding a cluster of non-zero valued quantized coefficients.

2DP: 2D position coding of (Rz, Rnz).

3DPA: 3D joint position and amplitude event defined by at least three variables, typically including Rz and Rnz.

1DA: 1D amplitude event and coding of the event. Hence HVLC2DP1DA means hybrid variable length coding with 2D position coding of clusters, and 1D coding of amplitudes.

CA: context adaptive, context-based. In the example methods herein, by context is meant one or more items of information determinable from previously encoded information and useful in predicting behavior, e.g., information determined from one or more previously coded coefficients.

Some Embodiments

Embodiments of the present invention include a method, an apparatus, logic encoded in one or more computer-readable tangible storage media to carry out a method, and a tangible, e.g., non-transitory computer-readable, storage medium. The method is to code one or more ordered series of quantized coefficients, each series obtained by transforming a block of image data, ordering and quantizing the transform coefficients.

There have already been many transform-based coding methods developed for compressing pictures, e.g., still pictures or moving pictures, and of these methods, many are standardized. Commonly these methods include partitioning a picture into blocks, transforming the blocks into transform coefficients, quantizing the transform coefficients, ordering the transform coefficients along a pre-determined path on the 2D transform domain, and entropy coding the ordered series of quantized transform coefficients. The picture may be inter-frame coded with motion compensation, or intraframe coded. Examples of standard coding methods include but are not limited to: ITU-T H.261, ITU-T H.263, ITU-T H.264/AVC, AVS (the Video Coding Standard of China), MPEG1, MPEG-2, DIRAC (an open source video codec designed and published by the BBC), VC-1, and so forth. See the above Section "Some abbreviations and description of some entropy coding methods" for more details on some of these standard methods.

Some of these coding standards define "a profile" as a set of factors applicable to a type of image and/or application. Within each profile, either the block size is fixed, or there is an option of more than one transform block size, but the same entropy coding method is used for all the block sizes. For example, the high profile of H.264/AVC allows either 4×4 or 8×8 pixel transform blocks, but the entropy coding method is the same for all the blocks of a picture. Similarly, the high profile of VC-1 allows for 4×4, 4×8, 8×4 and 8×8 transform blocks, but the entropy coding is the same for all these blocks of an image.

In an effort to continue improving coding efficiency, new generations of coding methods are continually being developed. While it is common to use different block size for motion compensation, and the present disclosure does not deal with the subject of motion compensation block size, one improvement being proposed is the use of image blocks of different size to which transforms are applied within the same profile. In accordance with an aspect of the present invention, a plurality of entropy coding processes may be used for different classes of ordered series of quantized coefficients of transformed blocks of image data for the same profile, e.g., the same picture, where the size of the block is one of the determiners of the class. By a "coding process" is meant a coding method or combination of methods. Each particular series is obtained by ordering the quantized transform coefficients of a particular block of pixels of an image along a selected path on the transform domain, typically from low frequency to high frequency. Each series of quantized coefficients is classified into one of a plurality of pre-defined classes according to one or more criteria, including the size of the block from which the series is formed, and, in some embodiments, according to how the coefficients are likely to be distributed in the series as determined by one or more factors. For each class, a corresponding set of one or more of the provided coding methods is used to code the series. Thus, the coding method or methods applied to any particular block of data depends on the size of the block and in some embodiments, the distribution of quantized transform coefficients as determined from one or more factors.

In accordance with an aspect of the present invention, a series of quantized transform coefficients of a block of image data may be classified into one of a pre-defined plurality of classes, wherein a class is defined by at least the size of the block and typically but not necessarily one or more other factors. The classified series is coded by one of a set of pre-defined entropy coding methods, a pre-defined entropy coding method being mapped to each class of the pre-defined plurality of classes. Thus, embodiments of the present invention use multiple types of entropy coding methods to code the quantized coefficient of various classes of transform blocks, wherein a class is defined by at least the size of the block and typically one or more other factors. In the embodiments described herein, at least some of the entropy coding methods are variable length coding methods.

FIG. 1 shows a simplified flow chart of a method in accordance with one embodiment of the present invention and includes accepting an ordered series of transform coefficients of a block of image data and in 101 classifying the accepted series into one of a plurality of pre-defined classes according to one or more factors including the size of the block of image data. In 103 the method proceeds into one of a set of paths depending on the classification. Let Nc denote the number of pre-defined classes, such classes denoted Class 1, Class 2 . . . , Class Nc. The method includes in one of 105-1, 105-2, . . . , 105-Nc applying one of a plurality of entropy coding methods to the accepted ordered series to form a sequence of codewords, the entropy coding method applied being according to the class of the accepted series. Hence, 105-1 includes applying the method for Class 1, 105-2 includes applying the method for Class 2, etc.

For at least two classes of ordered series of different sizes, different entropy coding methods are applied to the different classes.

The coding of a block produces a bitstream for decoding. A decoder needs to be able to decode the stream, and therefore needs to receive indication or to determine the class of the bitstream of any block.

In some embodiments, the bitstream for a set of blocks of a picture or sequence of pictures in the case of motion video, includes an indication of the factors sufficient for the decoder to ascertain the class of each block of the set of blocks of any sequence of codewords of a series in the bitstream.

Figure 2:
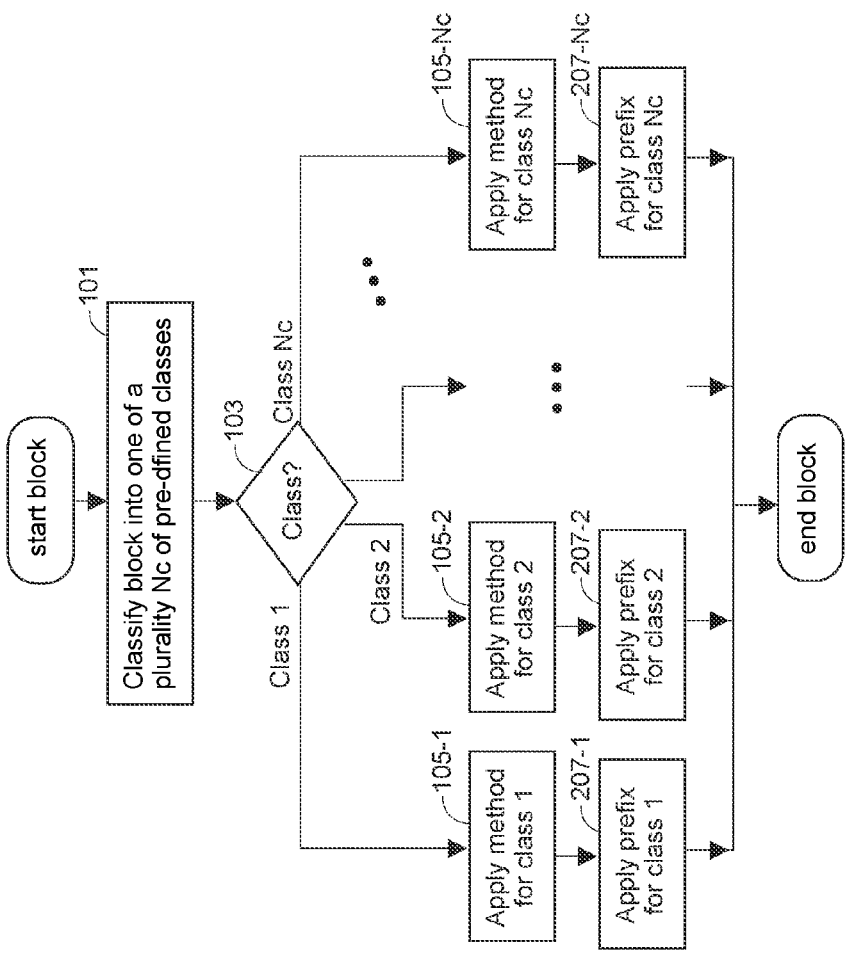
FIG. 2 shows a simplified flowchart in accordance with an embodiment of the present invention that includes providing an indication with the codewords of the class of a coded block.

In other embodiments, the sequence of codewords for a particular block includes an explicit indication of the class of the block. While those skilled in the art will understand many such indications can be used, in some embodiments of the present invention, the indication is in the form of a prefix. FIG. 2 shows a simplified flowchart of a method in accordance with an embodiment of the present invention, and includes, in addition to elements 101, 103, and 105-1, . . . , 105-Nc of FIG. 1, applying in 207-1, 207-2, 207-Nc the respective prefix for classes Class 1, Class 2 . . . , Class Nc, respectively, to the codewords from apply method elements 105-1, 105-2, . . . , 105-Nc, respectively.

In some embodiments, one or more pre-defined classes and associated entropy coding methods are pre-defined for each block size of a plurality of block sizes, e.g., a pre-defined set of block sizes. In such embodiments, the classifying includes classifying the series into a block size, and further classifying into one of the one or more pre-defined classes for the block size. Applying one of a plurality of pre-defined entropy coding methods applies the pre-defined entropy coding method for the predefined class for the pre-defined block size.

Figure 3:
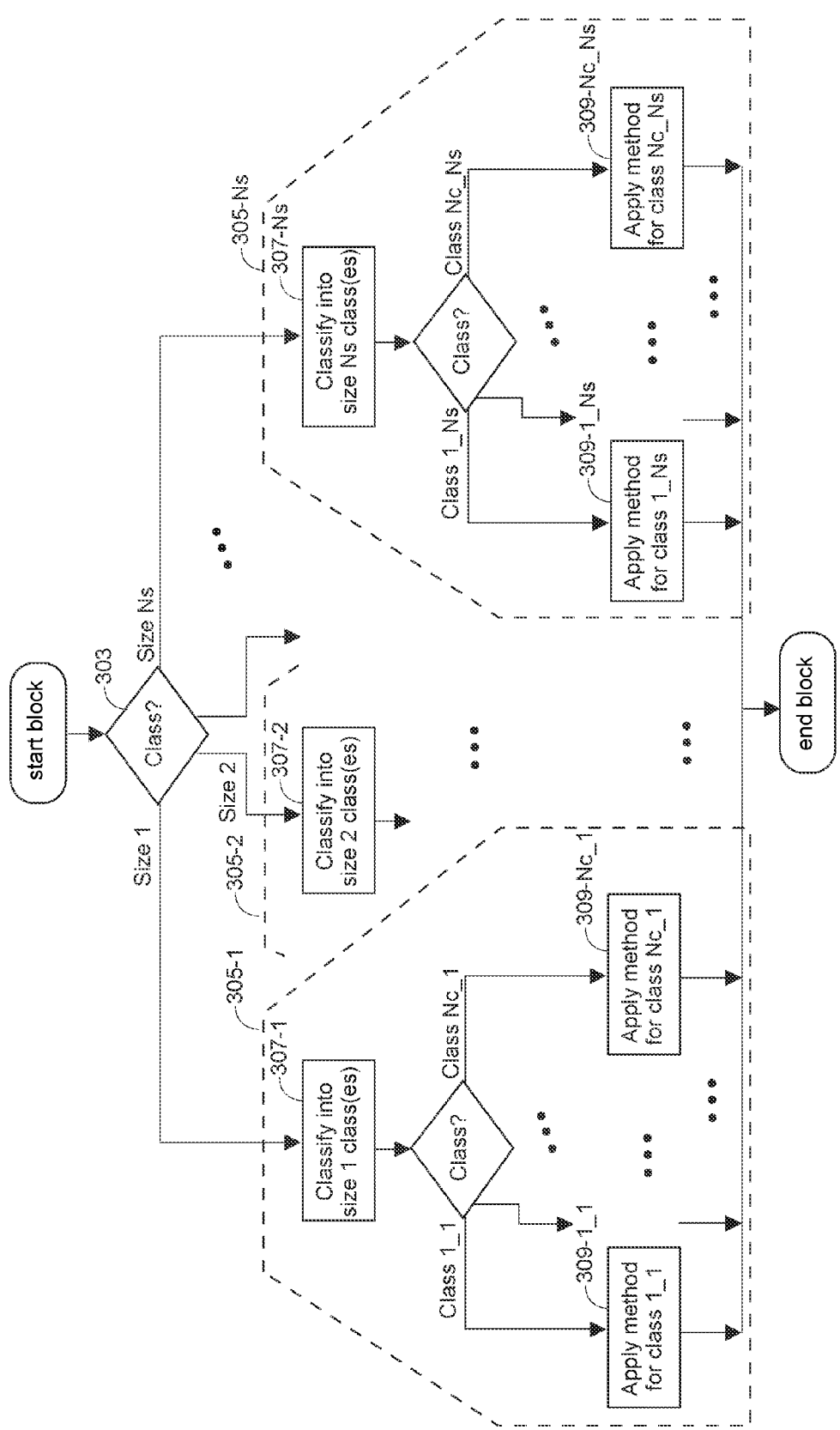
FIG. 3 shows a simplified flowchart in accordance with an embodiment of the present invention that includes classifying a series of quantized coefficients of a block according to the size and further classifying the series, for each size, to one of one or more classes pre-defined for the size.

For some such embodiments, the classification can be considered in two stages, the first stage being a classification into one of a plurality of pre-defined block sizes, and a further classification, for each block size, into one or more different classifications for that block size according to one or more factors. Denote by Ns the number of sizes of blocks, Ns >2, and denote the block sizes by Size 1, Size 2, . . . Size Ns. FIG. 3 shows a simplified flow chart of one embodiment of a method of entropy coding an ordered series of quantized transform coefficients of a block of image data that includes accepting the ordered series, and in 303 classifying the series into the block size of sizes Size 1, Size 2, . . . Size Ns. For each block size, the method includes in respective block 307-1, 307-2, . . . , 307-Ns, classifying into a number of classifications the block size, the number of classes for sizes Size 1, . . . , Size Ns denoted as Nc_1, Nc_Ns, each such number of classes being 1 or more. The classes are shown in FIG. 3 as Class 1_1, . . . , Class Nc_1 for Size 1, Class 1_2, . . . , Class Nc_2 for Size 2, and Class 1_Ns, . . . , Class Nc_Ns for Size Ns. After classification according to size, and if the size has more than one pre-defined class, according to the class for the size, the method includes in one of blocks 309-1_1, . . . , 309-Nc_1, 309-1_2, . . . , 309-Nc_2 .,,, 309-1_Ns, . . . , 309-Nc_Ns applying the entropy coding method for the size and class of the size. The sections of the flow chart for classifying and applying the entropy code for the class for each block size are shown as sections 305-1, 305-2, . . . , 305-Ns.

In some embodiments, the method comprises forming a bistream for all blocks of a picture or sequence of pictures. The bistream includes the codewords formed for the series of the blocks, and an indication of factors sufficient for a decoder to ascertain the size of each block, and the class for the size of the block of any formed sequence of codewords. The embodiment of FIG. 3 assumes such a bitstream, i.e., that the bitstream for the picture or sequence of pictures in the case of motion video, includes an indication of the factors sufficient for the decoder to ascertain the size of the block, and the class for the size of the blocks of any sequence of codewords. In an alternate version, the method includes adding a code, e.g., a prefix code to the codewords for any series of a block to indicate to a decoder the class of the block.

Figure 4:
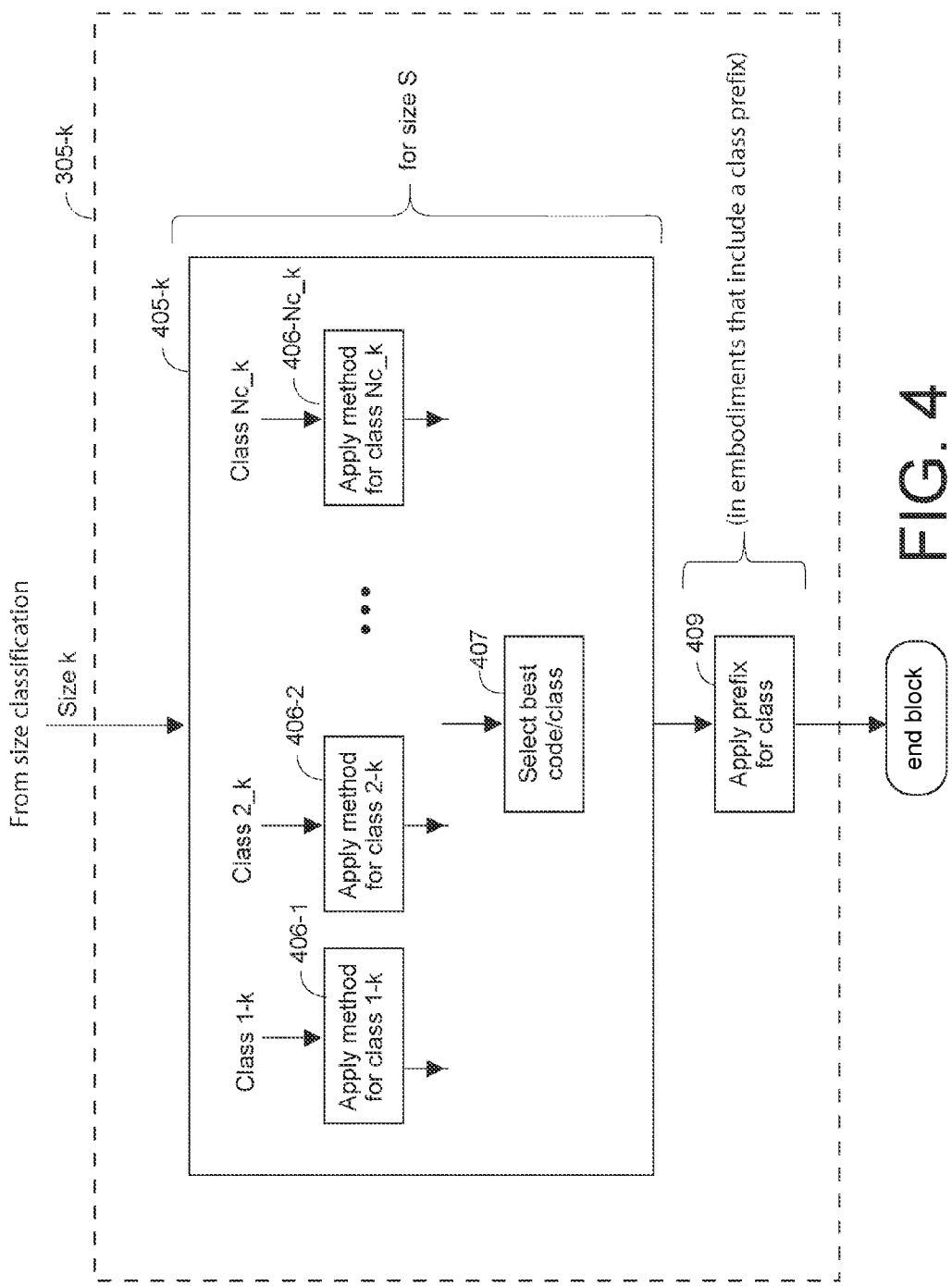
FIG. 4 shows a flow chart of a single section for single size of in accordance with an embodiment of the present invention.

While in some embodiments of the present invention, ascertaining which of the different entropy coding methods to use once the block has been classified by size is according to one or more factors, such as whether intraframe coded or interframe coded, whether high resolution or low resolution, the spatial complexity of the block of image data, the QP and so forth, in some embodiments of the present invention, each size of a block is pre-assigned a number of pre-defined coding methods, and a class for the size, and hence which entropy coding method is used is determined by calculating the results of applying the coding processes corresponding to the different classes for the size, and comparing the resulting compression achieved by applying the corresponding coding processes. The class that produced the shortest bitstream of code words is selected as the class for the size. A flowchart of such a method differs from the flowchart of FIG. 3 by having different sections 305-1, 305-2, . . . , 305-Ns for each of the Ns sizes. FIG. 4 shows a flow chart of a single section, denoted 305-k, for a size denoted Size k of a method in accordance with an embodiment of the present invention. The processes of section 305-k include in 405-k, for a block of the size Size k, the steps 406-1, 406-2, . . . , 406-Nc_k of coding the block by each corresponding coding process for the Nc_k coding methods for the Nc-k classes for Size k, and comparing the result to select the method that provides the best compression, i.e., the least number of bits for the coded block. In step 407, the selecting of the best class for a block is by selecting the code that leads to the fewest bits in the coded data. Following the selection, because the coding step would already have been carried out, step 409 applies the indication, e.g., as a prefix code. In some embodiments, adding the prefix code may be carried out earlier.

In one version of section 405-k, for a block of the size Size k, the steps 406-1, 406-2, . . . , 406-Nc_k are carried out sequentially on the series of coefficients. After each such processing by a corresponding process, a comparison is made and the set of codewords for that process that produces the least number of coded bits, i.e., the better compression, is maintained, as well as an indication of the class selected. The coding by each of the class's corresponding processes, of course, can be in any order. After each coding process for the series, the best result thus far and the corresponding class are stored, so that after each of the steps 406-1, 406-2, . . . , 406-Nc_k, the previously stored result is compared with the newly calculated result. At the end, the code words and best class are available, and a code indicating the class is added, e.g., as a prefix. In an alternate version, the prefix is added whenever the first or better result is saved in steps.

In an alternate version of section 405-k, the coding processes 406-1, 405-2, . . . 406-Nc_k, that correspond to each respective class for Size k are carried out in parallel on the series of coefficients. At the end of the methods being applied, a comparison is made of the results and the class is chosen according to which corresponding coding processes produced the least number of coded bits. A code indicating the class is added, e.g., as a prefix.

In the embodiments described herein, the entropy coding methods are all variable length coding (VLC) methods. The present disclosure, however is not limited to such methods. A VLC method includes recognizing events (also called symbols) defined by one or more parameters, and encoding the events using codewords such that, on average, events that are more likely to occur are encoded by respective codewords that are shorter than the respective codewords for events that are less likely to occur. In the embodiments described herein, the lookup of a codeword corresponding to an event uses one or more code mappings that map events to the codewords. In the embodiments described herein, the mappings of events to codewords are represented by coding tables, e.g., VLC tables to look up the codeword for a particular event to encode. However, those skilled in the art will understand that a table is only one data structure that can be used to maintain the codewords for a lookup. Therefore, by "table" is meant any data structure for storing the mapping from events to codewords, e.g., such that an event, e.g., a value or set of values, can be looked up.

The distribution of quantized coefficients along a pre-determined order can form various clusters of non-zero coefficients, as well as non-clustered (isolated) non-zero-coefficients. This distribution of clustered and non-clustered coefficients depends on many factors, including the complexity of the spatial picture block, the bit rate for the coding, the quantization parameter QP, whether the block is interframe or intraframe coded, and so forth. In general, there are likely to be more clustered coefficients for larger blocks and for more complex blocks than for smaller and/or less complex blocks. Furthermore, motion compensated interframe blocks are likely to be less complex than intraframe blocks, and hence are likely to have more clusters of non-zero-amplitude quantized coefficients.

Those skilled in the art will also understand that the VLC tables to be used are determined according to statistics of the events. In different versions, the statistics may be assumed based on measurements of similar pictures or sequences of pictures, or based on assumed statistics. Furthermore, those skilled in the art will understand that VLC tables need not include only variable length codes. In order to reduce the size of any particular table, some events that are relatively rare might be encoded by respective fixed length codewords rather than variable length codewords.

The parameters defining a to-be-coded event depend on the particular coding method, and may include, for example, the number of consecutive zero-valued coefficients preceding a cluster of one or more non-zero valued coefficients in the series, and/or the number of consecutive non-zero valued coefficients in a cluster, and so forth, as illustrated by some VLC methods described herein.

Some of the Coding Methods in More Detail

While the present example embodiments use such VLC methods as HVLC and its variations, and RL-VLC and its variations, the present disclosure is not limited to using these methods for entropy coding. The present disclosure includes any different entropy coding methods, e.g., VLC methods relevant to coding the transform coefficients for different classes of blocks, a class defined by at least the size of the block. The present disclosure is not limited by any particular entropy coding methods for the different classes of blocks. However, the example embodiments described herein do use some known VLC methods, and some of these are briefly described herein. See the "Some abbreviations and description of entropy coding methods" Section.

Hybrid VLC

Hybrid variable length coding (hybrid VLC, HVLC) includes partitioning the series into a first region, e.g., a low frequency region (possibly the whole series) and possibly a high frequency region, which also can be the whole series, with each region coded according to a different coding method. In some embodiments, there are more than two regions, with the first region being the low frequency region. For the description herein, at most two regions are assumed. How to modify the methods for the case of more than two regions would be straightforward to one skilled in the art from the description herein and in the cited references.

The low frequency region is a region where non-zero-valued coefficients are likely to be clustered into clusters of consecutive non-zero-valued coefficients, and the high frequency region is a region where non-zero-valued coefficients are likely to be sparse and isolated. Different VLC methods are used for coding the low and high frequency regions. The demarcation is defined by a breakpoint. Thus, the low frequency region VLC coding methods devised for HVLC and its variations may be particularly advantageous for coding clustered transform coefficients, while the high frequency VLC coding methods, e.g., RL-VLC and its variation may be more advantageous for coding non-clustered or isolated coefficients. There is likely to be an improvement in coding efficiency if HVLC, e.g., one of its variations such as context adaptive HVLC (CAHVLC) is applied to code the coefficients of larger transform blocks in which clusters are more likely to form, and RL-VLC or one of its variations such as CABAC (Context-based Adaptive Binary Arithmetic Coding) or CAVLC (context adaptive RL-VLC) is applied to code the coefficients of smaller transform blocks.

The low frequency region coding method includes coding the position of clusters of consecutive non-zero-valued coefficients, and coding the amplitudes of the non-zero-valued coefficients in the low frequency region (which may be the whole series). Some low frequency coding methods of some variations of HVLC include jointly coding position and amplitude. Some low frequency coding methods of some variations of HVLC include taking into account that amplitude 1 is the most likely to occur non-zero amplitude in clusters, and thus code the location of non-amplitude-one non-zero coefficients.

In many embodiments of HVLC, the breakpoint is "soft" in that, if the breakpoint is determined to be in the middle of a cluster, the breakpoint is moved so that the low frequency region ends at the end of the cluster. In many low frequency region methods, the coding of clusters includes encoding the single zero-valued coefficient that immediately follows the cluster.

In many high frequency region coding methods, an additional binary-valued parameter is used to indicate whether or not the non-zero-valued coefficient in a to-be-coded event is the last non-zero-valued coefficient in the ordered series.

CAPAC

Figure 5:
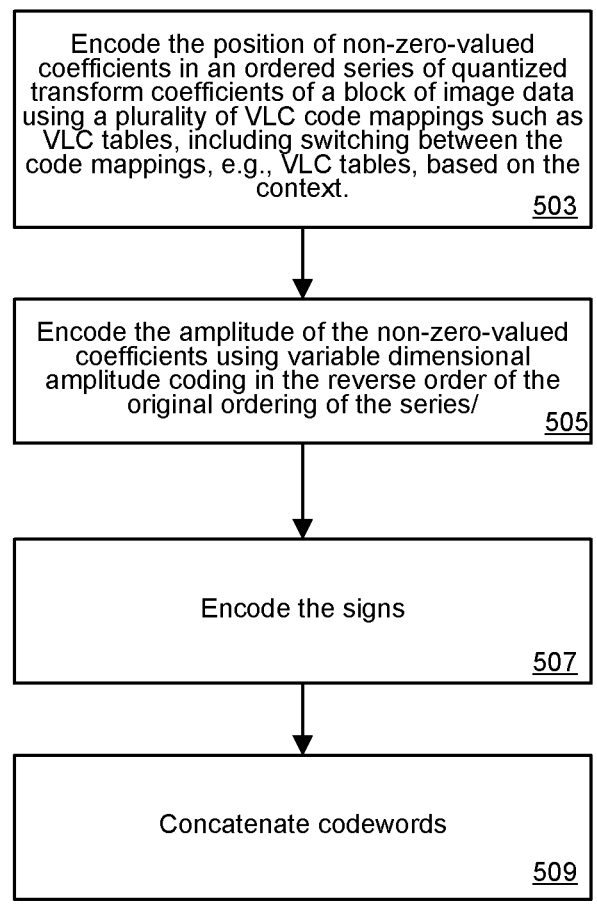
FIG. 5 shows a simplified flowchart of one embodiment of the low frequency method of Context Adaptive Position and Amplitude Coding (CAPAC).

The VLC coding methods in embodiments of CAPAC include a two-way position and amplitude coding process for a series of quantized coefficients. FIG. 5 shows a simplified flowchart of one embodiment of the low frequency method of CAPAC and includes in 503 encoding the position of non-zero-valued coefficients in an ordered series of quantized transform coefficients of a block of image data using a plurality of VLC code mappings such as VLC tables, including switching between the code mappings, e.g., VLC tables, based on the context. The method further includes in 505 encoding the amplitudes of the non-zero-valued coefficients using variable dimensional amplitude coding in the reverse order of the original ordering of the series. The method further includes in 507 encoding the signs of the non-zero-valued coefficients. The encodings produce codewords. One embodiment further includes in 509 concatenating the codewords.

The context for position encoding includes one or more parameters that are derivable from one or more previously encoded events, e.g., position events or amplitudes, such that an encoding process coding a current event, e.g., position event or amplitude(s), can derive the context at the time of encoding the current event. In one CAPAC embodiment, the one or more parameters of the context include the maximum run-length of the most likely-to-occur amplitude. In one embodiment, the one or more parameters of the context also or instead include the most recent run-length of the other than the most likely-to-occur amplitude. In one embodiment, the one or more parameters of the context also or instead include the relative frequency of the coefficients being coded, e.g., the total number of coefficients that have been encoded indicative of the relative frequency of the coefficients being coded.

In one embodiment of CAPAC, the variable dimensional amplitude coding uses a plurality of variable length code mappings that each maps events to codewords, and includes switching between the code mappings based on the context. In one embodiment, the one or more parameters of the context on which the switching of code mappings is based include the maximum previously encoded amplitude.

HVLC3DPA

Figure 6:
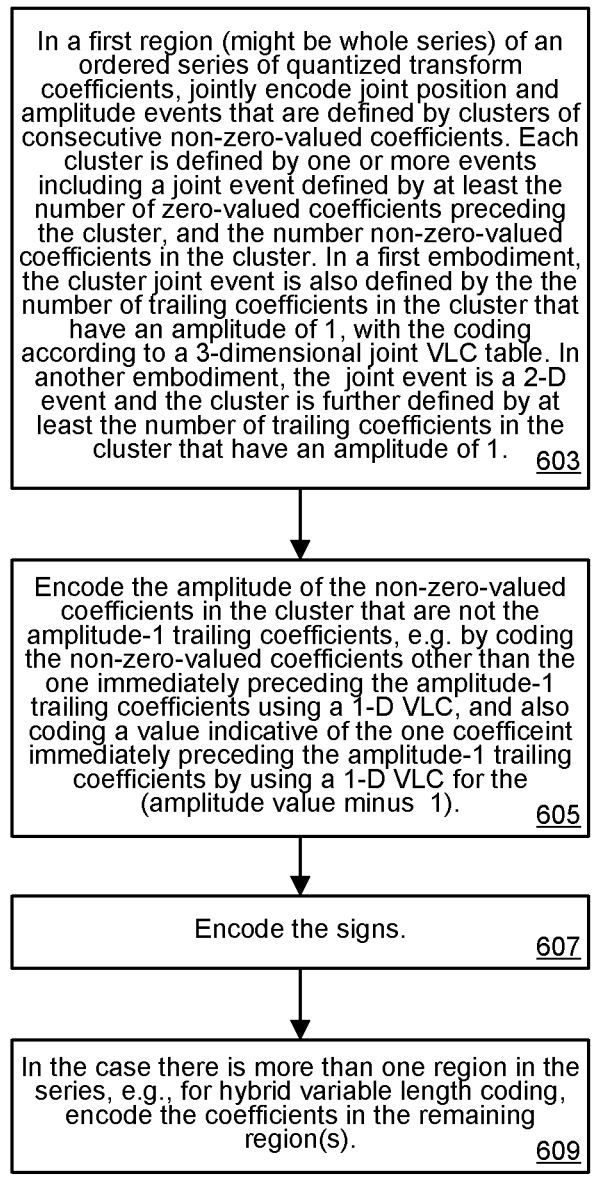
FIG. 6 shows a simplified flowchart of one embodiment of the low frequency-region coding of hybrid VLC with 3D position and amplitude coding denoted HVLC3DPA.

FIG. 6 shows a simplified flowchart of one embodiment of the low frequency-region coding of HVLC3DPA, i.e., HVLC with 3D position and amplitude coding. The method includes in 603 encoding the run-length of each cluster of non-zero valued quantized coefficients and the run-length of each cluster's preceding zero coefficients together as a pair, in combination with a parameter that indicates the number of trailing coefficients in that non-zero coefficient cluster that have an amplitude of 1. Remaining amplitudes are coded in 605 separately by a one-dimensional VLC mapping, e.g., a code table. The method includes in 607 encoding the signs, and in 609, in the case that there is more than one region in the series, encoding the coefficients in the remaining regions.

For notation, consider the case of HVLC3DPA, i.e., HVLC with 3D position and amplitude coding is used for a sequence or part thereof. In such a case, $C_{3D}$ denotes a 3DPA codeword for an event is defined by a cluster of non-zero valued coefficients, including the zero-valued coefficient immediately following the cluster, in the form $C_{3D}$ (Rz, Rnz, $T_1$, Ln) for the first event in a block, and C3D(Rz-1, Rnz, $T_1$, Ln), otherwise, in which:

Rz denotes the run of the zero-valued coefficients that precede the non-zero cluster.

Rnz denotes the run of the consecutive non-zero-valued coefficients.

$T_1$ denotes the number of trailing coefficients with amplitude 1 in the cluster of non-zero coefficients.

Ln denotes a binary-values value to indicate whether or not this is the last non-zero coefficient in the ordered series. In our notation, Ln=1 means this is the last non-zero valued coefficient.

$C_A$(Level) denotes the one-dimensional amplitude codeword for the amplitude value Level, Level denoting the amplitudes of all the remaining non-zero coefficients. One exception is the amplitude of the coefficient immediately preceding the trailing ones is reduced by 1 since this amplitude must be greater than 1.

As an example, consider the ordered series 9-5 3-2 1 0 0 2 1 1 0 0 0-1 1 0 0 1 1 0 ... that is classified to be encoded using the low frequency region of HVLC3DPA, i.e., the breakpoint is set such that there is only a low frequency region. Ignoring the codes for the signs of the coefficients, the series is encoded by the sequence of codewords: $C_{3D}(0,5,1,0)C_A(9)C_A(5)C_A(3)C_A(1)C_{3D}(1,3,2,0)C_A(1)C_{3D}(2,2,2,0)C_{3D}(1,2,2,0)$ ...

CAHVLC

CAHVLC incorporate, in some embodiments, the VLC schemes described in HVLC3DPA with the context adaptive essence of CAPAC.

Figure 7:
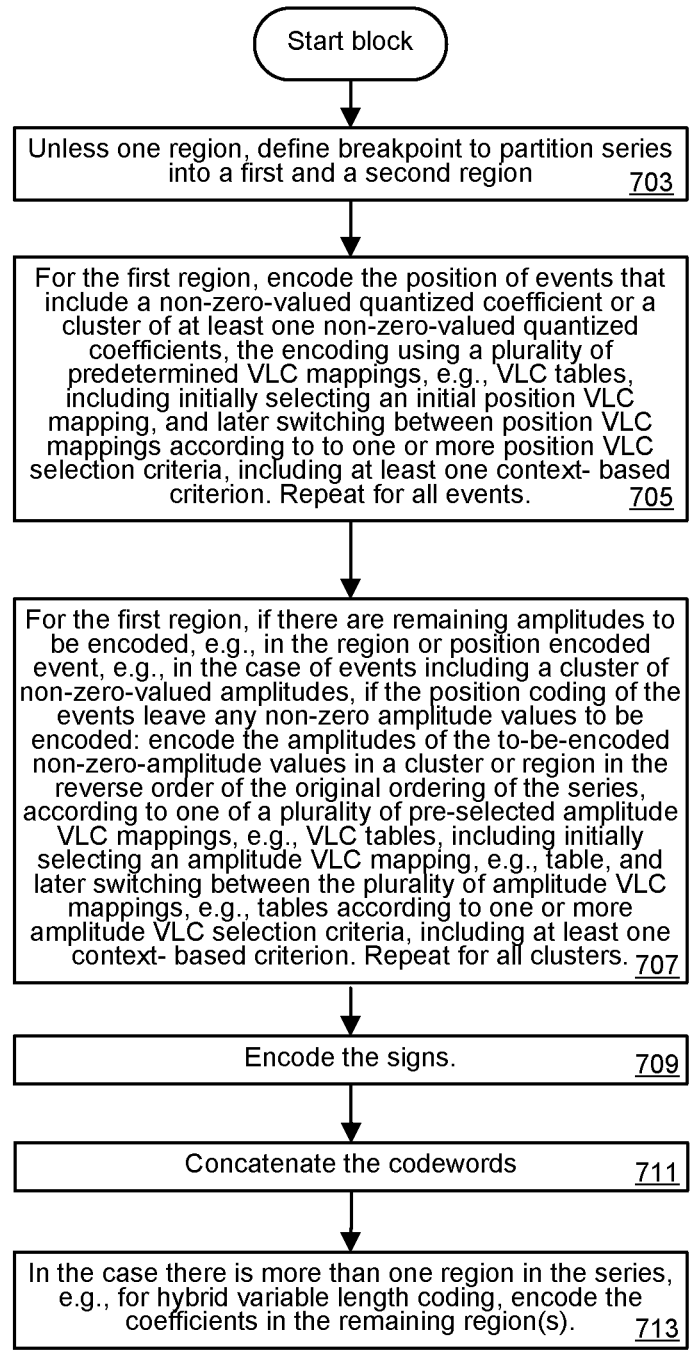
FIG. 7 shows a simplified flow chart of one method embodiment of Context Adaptive Hybrid Variable Length Coding (CAHVLC).

FIG. 7 shows a simplified flowchart of one method embodiment of CAHVLC of an ordered series quantized transform coefficients. The method includes in 703, unless there is only one region, defining a breakpoint to partition series into a first (low frequency) region and a second (high frequency) region.

The method further includes, in the first (low frequency region), encoding the ordered series coded as a sequence of clusters of consecutive non-zero-valued coefficients with run-length Rnz, Rnz≥1, preceded by a number of consecutive zeroes with run-length Rz, Rz≥0, and followed by one zero. For instance, a coefficient sequence: 9 5 3 0 1 3 0 0 1 0 . . . (all zeroes) are coded as three coefficient clusters: 9 5 3 0, 1 3 0, and 0 1 0. In 705, in the first region, the method includes encoding the position of events that each includes Rnz, Rnz≥1, non-zero-valued quantized coefficient, the encoding using a plurality of predetermined VLC mappings, e.g., VLC tables, including initially selecting an initial position VLC mapping, and later switching between position VLC mappings according to one or more position VLC selection criteria, including at least one context-based criterion. This is repeated for all events in the low frequency region. The method includes, in 707, for the first region, if the position coding of the events leave any non-zero amplitude values to be encoded, encoding the amplitudes of the to-be-encoded non-zero-amplitude values in a cluster or region in the reverse order of the original ordering of the series, according to one of a plurality of pre-selected amplitude VLC mappings, e.g., VLC tables, including initially selecting an amplitude VLC mapping, e.g., table, and later switching between the plurality of amplitude VLC mappings, e.g., tables according to one or more amplitude VLC selection criteria, including at least one context- based criterion. This is repeated for all clusters. In 709, the method includes encoding the signs, and in 711, concatenating the codewords. In the case there is more than one region in the series, e.g., for hybrid variable length coding, the method includes in 713 encoding the coefficients in the remaining region(s).

In one version, each coefficient cluster is represented by one three-dimensional position-amplitude (3DPA) event followed by a certain number of one-dimensional amplitude (MA) events. Each 3DPA event has a form of $(Rz, Rnz, T_1)$, where Rz, Rnz are the run-length of zeroes and non-zeroes, respectively, and $T_1 \leq Rnz$ is the number of trailing coefficients in that cluster that have a magnitude of 1. For example, a coefficient cluster: 0 0 0 6 2 1 1 1 0 will be represented by a 3DPA event (3, 5, 3) with two remaining amplitudes (6 and 2); another cluster: 0 0 0 6 1 2 1 1 0 will be represented by a 3DPA event (3, 5, 2) with three remaining amplitudes (6, 1, and 2).

The magnitudes other than the $T_1$ trailing ones in each cluster are coded by 1DA in a reverse scan order. In other words, coding starts from the non-1 coefficient immediately preceding the $T_1$ trailing ones in the cluster and moves toward the lower frequency. For example, for the coefficient cluster 0 0 0 6 1 2 1 1 0, the three remaining amplitudes (6, 1, 2) requires additional one-dimensional amplitude coding.

Multiple code tables are used for both 3DPA and 1DA coding and the code table is adaptively chosen based on the derivable context information from coded neighboring blocks or from the coded portion of the currently being coded block. In CAHVLC, three contexts are exploited in predicting the coefficient distribution and determining VLC tables: (1) the numbers of non-zero coefficients in the neighboring blocks, which are used to predict the number of non-zero coefficients in the present block; (2) the run-length of non-zero run and zero run of previously coded coefficient clusters in the current block; (3) the magnitudes of previously coded non-zero coefficients in each non-zero cluster (in the reverse order) of the current block.

CABAC, CAVLC, and C2DVLC

Because CABAC and CAVLC are described in the well-known and widely used H.264/AVC standard, no detailed description of these methods is provided herein. Similarly, C2DVLC: is a variation of RL-VLC that is described for China's AVS (Audio Video Coding Standard of China.).

CAVLC takes advantage of several characteristics of quantized 4×4 blocks, including that the ordered series are typically sparse, containing mostly zeroes. CAVLC uses run-level coding to compactly represent strings of zeroes. CAVLC also uses the observation that the highest non-zero coefficients in the ordering often have amplitude 1. The number of high-frequency amplitude-1 coefficients is called the "Trailing 1s," and are encoded in a compact way. One implementation allows only up to three Trailing 1s. Any more are treated as if they have a non-zero amplitude greater than 1. CAVLC also advantageously uses that the number of non-zero coefficients in neighboring blocks is correlated. The number of coefficients is encoded using a look-up table; the choice of look-up table depends on the number of non-zero coefficients in neighboring blocks. CAVLC also advantageously uses that the magnitude of non-zero coefficients tends to be higher at the start ordered sequence near the DC coefficient and lower towards the higher frequencies. CAVLC takes advantage of this by adapting the choice of VLC look-up table for a "level" parameter depending on recently-coded level magnitudes.

Figure 8:
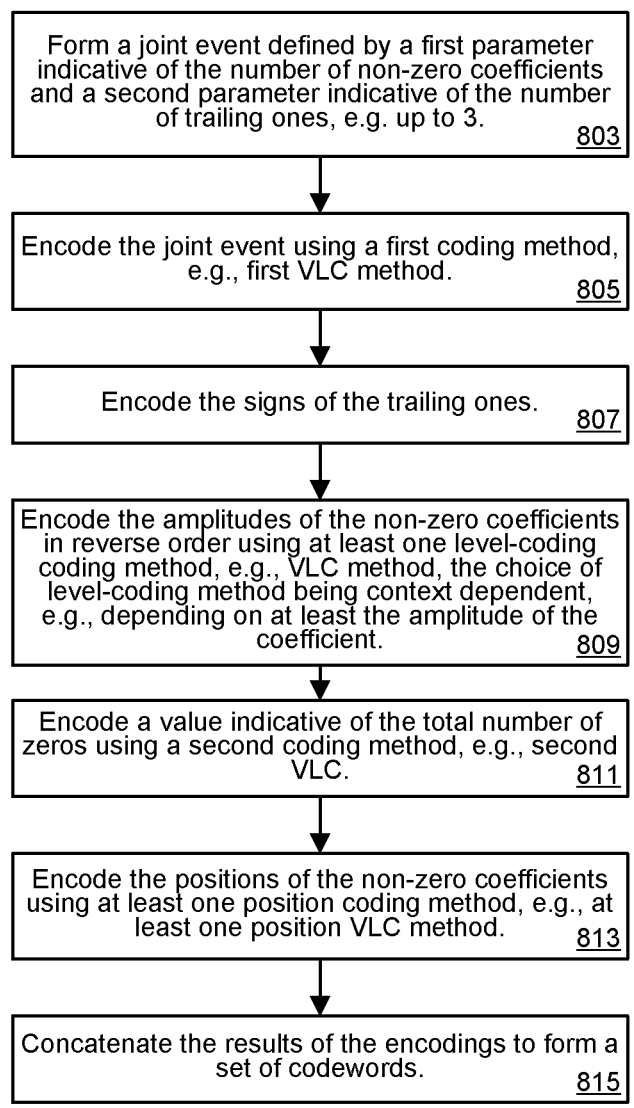
FIG. 8 shows a simplified flowchart one embodiment of a generalization of Context Adaptive Hybrid Variable Length Coding (CAVLC) as used, e.g., in H.264/AVC.

FIG. 8 shows a simplified flowchart of one embodiment of a generalization of CAVLC for coding such an ordered sequence of quantized transform coefficients and includes in 803 forming a joint event defined by the number of non-zero coefficients and the number of trailing amplitude-one coefficients. Any trailing amplitude 1 other than the last three is treated as a non-amplitude 1 coefficient. The method further includes in 805 encoding the joint event, e.g., using a first VLC method, e.g., using a first 2-D VLC table and in 807 encoding the sign of each trailing one. The method further includes in 809 encoding the values of the remaining non-zero coefficients in a reverse order using a level coding method, e.g., a variable length coding (VLC) method, e.g., using a VLC table selected from a number, e.g., seven VLC tables to encode each value adapts depending on the magnitude of each successive coded value. This is what is called the context adaptive property. The method further includes in 811 encoding the total number of zeroes before the last coefficient, the coding in one implementation using VLC. The method further includes in 813 encoding the position of the non-zero coefficients by encoding the number of zeroes (Rz, the run-length) preceding each non-zero coefficient in reverse order, starting with the highest frequency, except (a) if there are no more zeroes left to encode, it is not necessary to encode any more Rz values, and it is not necessary to encode for the final (lowest frequency) non-zero coefficient. In one version, the encoding of the position uses a position encoding method that in typically is a VLC coding method to encode the run-lengths of preceding zeroes using VLC tables. The VLC chosen depending on (a) the number of zeroes that have not yet been encoded, and (b) the value of Rz. The method further includes in 815 concatenating the codewords produced by the encodings to form a set of codewords—the bitstream—for the ordered sequence of coefficients. If there are additional regions, the method includes encoding the quantized coefficients in those regions.

An improvement of CAVLC includes, for the first position coding method, what we call a "mixed run-length position coding" method in the encoding of the positions of nonzero coefficients. Instead of solely coding the run-lengths of zeroes, one mixed coding method embodiment includes repeating encoding either a run-length of a run of zeroes or a run-length of a run of nonzero coefficients, one or the other, depending on the numbers of zeroes and nonzero coefficients remaining to be coded.

As for notation, consider an ordered series that has been classified to use HVLC with RL-VLC for the second high frequency region, e.g., consider a class for which CAVLC as used in H.265/AVC is used for a high frequency region of the series which can be the whole series. For such a region:

$C_{RL}$(Rz, Level, Ln) denotes the codeword of an event defined by three parameters, where:

Rz: denoted the length, possibly 0, of the run of consecutive zero-valued coefficients that precedes a non-zero valued coefficient.

Level denoted the amplitude of the non-zero coefficient that immediately follows the preceding run of zero-valued coefficients.

Ln denotes a binary-values value to indicate whether or not this is the last non-zero coefficient in the ordered series. In our notation, Ln=1 means this is the last non-zero valued coefficient.

For example, consider an ordered series that has been classified into a class in which HVLC3DPA is used, with CAVLC used for the high frequency region, and consider the example ordered series:

9-5 3-2 1 0 0 2 1 1 0 0 0 -1 1 0 0 0 1 0 . . .

Suppose the breakpoint is set at 14, and it is a soft breakpoint in that it does not break up a cluster. The sequence of codewords, ignoring the codes for the sign, is $C_{3D}(0,5,1,0)C_A(9)C_A(5)C_A(3)C_A(1)C_{3D}(1,3,2,0)C_A(1)C_{3D}(2,2,2,0)C_{RL}(2,1,1)$ . . .

As another example, consider an ordered series that has been classified to use

HVLC with RL-VLC for the second high frequency region, e.g., consider a class for which C2DVLC as used in AVS is used for a high frequency region of the series which can be the whole series.

For such a region, the notation for the codewords is the same as for CAVLC, with the difference that in AVS, the ordering (scan in the 2D transform domain) is in the reverse direction from high to low frequency.

Indicating sign, and the last non-zero coefficient in a series

Those skilled in the art will understand that there are many ways to indicate the sign of each non-zero-valued coefficient in an ordered series. Any codewords to indicate sign are not shown in any of the examples provided herein.

Those skilled in the art also understand that there are many ways to indicate the last non-zero-valued coefficient in a series. One method is to use a special codeword to indicate the end of the series, i.e., to indicate that the remainder of the series has only zero-valued coefficients. Another method is to add a binary-valued indicator to each event being coded to indicate if that event is the last event with a non-zero-valued coefficient, i.e., if the rest of the ordered series consists of only zeroes. When the latter method is sued, e.g., to encode a 3DPA event, there are four parameters rather than three parameters, the last parameter denoted Ln is the indicator that the remainder of the ordered series includes only zero-valued coefficients. Similarly, the CAVLC examples herein, the 2D_RL event defined by Rz and Level includes a third parameter denoted Ln to indicate that the event includes the last non-zero amplitude in the ordered series.

This skilled in the art will understand that often, in order to shorten the size of code mappings, e.g., VLC tables, some codewords may be determined from the events by an "escape" code followed by a calculated codeword that does not involve a table lookup. Such methods are in accordance with embodiments of the present invention.

Aspects of the present invention can best be illustrated by examples as follows:

Some Example Classifications and Coding Methods Therefor

In the following examples, consider a transform coding method that uses a plurality of different block sizes for transforms, e.g., 4 block sizes of 32×32, 16×16, 8×8, 4×4, or five block sizes of 64×64, 32×32, 16×16, 8×8, 4×4, or another plurality of sizes in which blocks need not be square. A method in accordance with one embodiment of the present invention includes classifying each block of a picture into one of a plurality of pre-defined block classes, and for any block class, using an entropy coding method, e.g., a VLC method that is pre-defined for the block size, such that a plurality of entropy coding methods is used for an picture that has blocks of a plurality of block classes. The classification into block sizes is according to at least the size of the block. For each classified block, the corresponding coding method may include HVLC in which the ordered series of quantized transform coefficients is partitioned into two or more regions according to the distribution of non-zero-valued coefficients in the series, and a different coding method used for coding quantized coefficients in each region.

In the following examples, the following VLC methods are used for different classes, with more than one method used for a class for which one of the variations of HVLC is used, and there is a low frequency region and a high frequency region demarcated by a (soft) breakpoint, such that the demarcation is never in the middle of a cluster of non-zero-valued coefficients.

A Classification Example with Block Sizes as Large as 64×64

Class number: 1

Block size: 64×64 (16n×16n)

Observations about typical such series of quantized coefficients: Most non-zero coefficients along the ordering of the series are of large amplitudes and they are clustered throughout most of the frequency spectrum.

Example additional factors(s) determining the class: Inter-frame, high-resolution, complex scene, high bit-rate/low QP.

Predefined coding method(s) for the class: CAHVLC for the entire series, i.e., the entire frequency spectrum.

Note: High-resolution video tends to use large block size.

Class number: 2

Block size: 32×32 (8n×8n)

Observations about typical such series of quantized coefficients: Most non-zero coefficients along the ordering of the series are of large amplitudes and they are clustered throughout most of the frequency spectrum.

Example additional factors(s) determining the class: Intraframe, high-resolution, complex scene, high bit-rate/low QP Predefined coding method(s) for the class: CAHVLC for the entire series, but with different VLC tables than for the class with 64×64 block size. Note: High-resolution video tends to use large block size.

Class number: 3

Block size: 32×32 (8n×8n)

Observations about typical such series of quantized coefficients: Most non-zero coefficients along the ordering of the series are of small amplitudes, essentially dominated by amplitude 1, and they non-zero coefficients are clustered throughout most of the series (the frequency spectrum).

Example additional factors(s) determining the class: Interframe, high-resolution, complex scene, low bit-rate/high QP.

Predefined coding method(s) for the class: HVLC3DPA for the entire series.

Note: High-resolution video tends to use large block size.

An example sequence: 9-5 3-2 1 0 0 2 1 1 0 0 0-1 1 0 0 1 1 0 . . .

Codewords (excluding codes for sign): $C_{3D}(0,5,1,0)C_A(9)$ $C_A(5)C_A(3)C_A(1)$ $C_{3D}(1,3,2,0)C_A(1)C_{3D}(2,2,2,0)C_{3D}(1,2,2,0)$ . . .

Class number: 4

Block size: 32×32 (8n×8n)

Observations about typical such series of quantized coefficients: Most non-zero coefficients along the ordering of the series are of large amplitudes and they are clustered in the low frequency region and scattered in the high frequency region.

Example additional factors(s) determining the class: Interframe, high-resolution, simple scene, low bit-rate/high QP.

Predefined coding method(s) for the class: HVLC, in particular, HVLC3DPA for the low frequency region and RL VLC, in particular CAVLC used in H.264/AVC for the high frequency region.

Note: High-resolution video tends to use large block size.

An example sequence: 9-5 3-2 1 0 0 2 1 1 0 0 0-1 1 0 0 0 1 0 . . .

Codewords (excluding codes for sign): $C_{3D}(0,5,1,0)C_A(9)$ $C_A(5)C_A(3)C_A(1)$ $C_{3D}(1,3,2,0)C_A(1)C_{3D}(2,2,2,0)C_{RL}(2,1,1)$ . . .

Class number: 5

Block size: 16×16 (4n×4n)

Observations about typical such series of quantized coefficients: Most non-zero coefficients along the ordering of the series are of large amplitudes and they are clustered throughout most of the series, i.e. the whole frequency spectrum.

Example additional factors(s) determining the class: Intraframe, high-resolution, complex scene, high bit-rate/low QP.

Predefined coding method(s) for the class: CAHVLC for the entire ordered series, with different VLC tables than using CAHVLC for a 32×32 block size class.

Note: High-resolution video tends to use large block size.

Class number: 6

Block size: 16×16 (4n×4n)

Observations about typical such series of quantized coefficients: Most non-zero coefficients along the ordering of the series are of small amplitudes (essentially dominated by 1) and they are clustered in the low frequency region and scattered in the high frequency region.

Example additional factors(s) determining the class: Interframe, high-resolution, complex scene, low bit-rate/high QP.

Predefined coding method(s) for the class: HVLC, with HVLC3DPA for the low frequency region and RL VLC, in particular C2DVLC as used in AVS, for the high frequency region.

Note: High-resolution video tends to use large block size.

An example sequence: 9-5 3-2 1 0 0 2 1 1 0 0 0-1 1 0 0 0 0 0 0 0 1 . . .

Codewords (excluding codes for sign): $C_{3D}(0,5,1,0)C_A(9)$ $C_A(5)C_A(3)C_A(1)$ $C_{3D}(1,3,2,0)C_A(1)C_{3D}(2,2,2,0)C_{RL}(7,1,1)$ . . .

Class number: 7

Block size: 8×8 (2n×2n) Observations about typical such series of quantized coefficients: Most non-zero coefficients along the ordering of the series are of large amplitudes and they are clustered in the low frequency region and scattered in the high frequency region.

Example additional factors(s) determining the class: Intraframe, high-resolution, complex scene, high bit-rate/low QP.

Predefined coding method(s) for the class: HVLC, with HVLC2DP1DA for the low frequency region and RL VLC, in particular C2DVLC as used in AVS, for the high frequency region.

Class number: 8

Block size: 8×8 (2n×2n)

Observations about typical such series of quantized coefficients: Most non-zero coefficients along the ordering of the series are of small amplitudes (essentially dominated by 1) and they are clustered in the low frequency region and scattered in the high frequency region.

Example additional factors(s) determining the class: Intraframe, high-resolution, simple scene, low bit-rate/high QP, Predefined coding method(s) for the class: HVLC, with HVLC3DPA for the low frequency region and RL_VLC, in particular C2DVLC as used in AVS, for the high frequency region.

Class number: 9

Block size: 8×8 (2n×2n)

Observations about typical such series of quantized coefficients: Most non-zero coefficients along the ordering of the series are of large amplitudes and they are scattered throughout most of the frequency spectrum.

Example additional factors(s) determining the class: Interframe, low-resolution, simple scene, low bit-rate/high QP.

Predefined coding method(s) for the class: RL_VLC for the entire ordered series, in particular C2DVLC as used in AVS.

An example sequence: 0 0 0 0 1 0 0 2 0 1 0 0 0-1 0 0 0 1 1 0 . . .

Codewords (excluding codes for sign): $C_{RL}(4,1,0)C_{RL}(2,2,0)C_{RL}(1,1,0)$ $C_{RL}(3,1,0)C_{RL}(3,1,0)C_{RL}(0,1,1)$ Class number: 10

Block size: 4×4 (n×n)

Observations about typical such series of quantized coefficients: Most non-zero coefficients along the ordering of the series are of large amplitudes and they are scattered throughout the ordered series, i.e., throughout most of the frequency spectrum.

Example additional factors(s) determining the class: Intraframe, high-resolution, complex scene, high bit-rate/low QP.

Predefined coding method(s) for the class: RL_VLC for the entire ordered series, in particular CAVLC used in H.264/AVC.

An example sequence: 9-5 0 0 1 0 0 2 0 1 0 0 0 -1 0 0 0 1 1 0 . . .

Codewords (excluding codes for sign): $C_{RL}(0,9,0)C_{RL}(0,5,0)C_{RL}(2,1,0)$  $C_{RL}(2,2,0)C_{RL}(1,1,0)C_{RL}(3,1,0)C_{RL}(3,1,0)C_{RL}(0,1,1)$ Class number: 11

Block size: 4×4 (n×n)

Observations about typical such series of quantized coefficients: Most non-zero coefficients along the ordering of the series are of small amplitudes (essentially dominated by 1) and they are scattered throughout most of the frequency spectrum.

Example additional factors(s) determining the class: Interframe, low-resolution, simple scene, low bit-rate/high QP Predefined coding method(s) for the class: RL_VLC for the entire ordered series, in particular CAVLC but with an alternative coding scheme to take advantage of the dominant low amplitude coefficients, e.g., using ICAVLC A classification example with block sizes as large as 32×32

Class number: 1

Block size: 32×32 (8n×8n)

Observations about typical such series of quantized coefficients: Most non-zero coefficients along the ordering of the series are of large amplitudes and they are clustered throughout most of the frequency spectrum.

Example additional factors(s) determining the class: Intraframe, high-resolution, complex scene, high bit-rate/low QP Predefined coding method(s) for the class: CAHVLC for the entire ordered series.

Note: High-resolution video tends to use large block size.

Class number: 2

Block size: 32×32 (8n×8n)

Observations about typical such series of quantized coefficients: Most non-zero coefficients along the ordering of the series are of small amplitudes (essentially dominated by 1) and they are clustered throughout most of the frequency spectrum.

Example additional factors(s) determining the class: Interframe, high-resolution, complex scene, low bit-rate/high QP Predefined coding method(s) for the class: HVLC3DPA for the entire ordered series.

Note: High-resolution video tends to use large block size.

An example sequence: 9-5 3-2 1 0 0 2 1 1 0 0 0 -1 1 0 0 1 1 0 . . .

Codewords (excluding codes for sign): $C_{3D}(0,5,1,0)C_A(9)$ $C_A(5)C_A(3)C_A(1)$ $C_{3D}(1,3,2,0)C_A(1)C_{3D}(2,2,2,0)C_{3D}(1,2,2,0)$ . . .

Class number: 3

Block size: 32×32 (8n×8n)

Observations about typical such series of quantized coefficients: Most non-zero coefficients along the ordering of the series are of large amplitudes and they are clustered in the low frequency region and scattered in the high frequency region.

Example additional factors(s) determining the class: Interframe, high-resolution, simple scene, low bit-rate/high QP Predefined coding method(s) for the class: HVLC with HVLC3DPA for the low frequency region and RL_VLC, in particular CAVLC (used in H.264/AVC), for the high frequency region.

Note: High-resolution video tends to use large block size.

An example sequence: 9-5 3-2 1 0 0 2 1 1 0 0 0 -1 1 0 0 0 1 0 . . .

Codewords (excluding codes for sign): $C_{3D}(0,5,1,0)C_A(9)$ $C_A(5)C_A(3)C_A(1)C_{3D}(1,3,2,0)C_A(1)C_{3D}(2,2,2,0)C_{RL}(2,1,1)$ . . .

Class number: 4

Block size: 16×16 (4n×4n)

Observations about typical such series of quantized coefficients: Most non-zero coefficients along the ordering of the series are of large amplitudes and they are clustered throughout most of the frequency spectrum.

Example additional factors(s) determining the class: Intraframe, high-resolution, complex scene, high bit-rate/low QP Predefined coding method(s) for the class: CAHVLC for the entire ordered series (different VLC tables from 32×32 block size).

Note: High-resolution video tends to use large block size.

Class number: 5

Block size: 16×16 (4n×4n)

Observations about typical such series of quantized coefficients: Most non-zero coefficients along the pre-determined path are of small amplitudes (essentially dominated by 1) and they are clustered in the low frequency region and scattered in the high frequency region.

Example additional factors(s) determining the class: Interframe, high-resolution, complex scene, low bit-rate/high QP Predefined coding method(s) for the class: HVLC with HVLC3DPA for the low frequency spectrum and RL_VLC, in particular C2DVLC (used in AVS), for the high frequency region.

Note: High-resolution video tends to use large block size.

An example sequence: 9-5 3-2 1 0 0 2 1 1 0 0 0 -1 1 0 0 0 0 0 0 0 1 . . .

Codewords (excluding codes for sign): $C_{3D}(0,5,1,0)C_A(9)C_A(5)C_A(3)C_A(1)C_{3D}(1,3,2,0)C_A(1)$ $C_{3D}(2,2,2,0)C_{RL}(7,1,1)$ . . .

Class number: 6

Block size: 8×8 (2n×2n)

Observations about typical such series of quantized coefficients: Most non-zero coefficients along the ordering of the series are of large amplitudes and they are clustered in the low frequency region and scattered in the high frequency region.

Example additional factors(s) determining the class: Intraframe, high-resolution, complex scene, high bit-rate/low QP.

Predefined coding method(s) for the class: HVLC with HVLC2DP1DA for the low frequency region and RL_VLC, in particular C2DVLC (used in AVS), for the high frequency region.

Class number: 7

Block size: 8×8 (2n×2n)

Observations about typical such series of quantized coefficients: Most non-zero coefficients along the ordering of the series are of small values (essentially dominated by 1) and they are clustered in the low frequency region and scattered in the high frequency region.

Example additional factors(s) determining the class: Intraframe, high-resolution, simple scene, low bit-rate/high QP.

Predefined coding method(s) for the class: HVLC with HVLC3DPA for the low frequency region and RL_VLC, in particular C2DVLC (used in AVS), for the high frequency region.
Class number: 8
Block size: 8×8 (2n×2n)
Observations about typical such series of quantized coefficients: Most non-zero coefficients along the ordering of the series are of large amplitudes and they are scattered throughout most of the frequency spectrum.
Example additional factors(s) determining the class: Interframe, low-resolution, simple scene, low bit-rate/high QP.
Predefined coding method(s) for the class: RL_VLC for the entire ordered series, in particular C2DVLC (used in AVS).
An example sequence: 0 0 0 0 1 0 0 2 0 1 0 0 0 -1 0 0 0 1 1 0 . . .
Codewords (excluding codes for sign): $C_{RL}(4,1,0)C_{RL}(2,2,0)C_{RL}(1,1,0)C_{RL}(3,1,0)C_{RL}(3,1,0)C_{RL}(0,1,1)$
Class number: 9
Block size: 4×4 (n×n)
Observations about typical such series of quantized coefficients: Most non-zero coefficients along the ordering of the series are of large amplitudes and they are scattered throughout most of the frequency spectrum.
Example additional factors(s) determining the class: Intraframe, high-resolution, complex scene, high bit-rate/low QP.
Predefined coding method(s) for the class: RL_VLC for the entire ordered series, in particular CAVLC (used in H.264/AVC).
An example sequence: 9-5 0 0 1 0 0 2 0 1 0 0 0 -1 0 0 0 1 1 0 . . .
Codewords (excluding codes for sign): $C_{RL}(0,9,0)C_{RL}(0,5,0)C_{RL}(2,1,0)C_{RL}(2,2,0)C_{RL}(1,1,0)C_{RL}(3,1,0)C_{RL}(3,1,0)C_{RL}(0,1,1)$
Class number: 10
Block size: 4×4 (n×n)
Observations about typical such series of quantized coefficients: Most non-zero coefficients along the ordering of the series are of small values (essentially dominated by 1) and they are scattered throughout most of the frequency spectrum.
Example additional factors(s) determining the class: Interframe, low-resolution, simple scene, low bit-rate/high QP.
Predefined coding method(s) for the class: RL_VLC for the entire ordered series, in particular CAVLC but with an alternative coding scheme to take advantage of the dominant low amplitude coefficients, e.g., using ICAVLC.

A classification example with block sizes as large as 32×32, and five classes

Class number: 1
Block size: 32×32 (8n×8n)
Observations about typical such series of quantized coefficients: Most non-zero coefficients along the ordering of the series are clustered throughout most of the frequency spectrum.
Example additional factors(s) determining the class: Interframe, high-resolution, complex scene, high bit-rate, low QP.
Predefined coding method(s) for the class: HVLC with HVLC3DPA for the entire ordered series.
An example sequence: 9-5 3-2 1 0 0 2 1 1 0 0 0-1 1 0 0 1 1 0 . . .
Codewords (excluding codes for sign): $C_{3D}(0,5,1,0)C_A(9)C_A(5)C_A(3)C_A(1)$  $C_{3D}(1,3,2,0)C_A(1)C_{3D}(2,2,2,0)C_{3D}(1,2,2,0)$ . . .
Class number: 2
Block size: 32×32 (8n×8n)
Observations about typical such series of quantized coefficients: Most non-zero coefficients along the ordering of the series are clustered in the low frequency region and scattered in the high frequency region.
Example additional factors(s) determining the class: Interframe, high-resolution, complex scene, low bit-rate, high QP.
Predefined coding method(s) for the class: HVLC with HVLC3DPA for the low frequency region and RL_VLC for the high frequency region. 9-5 3-2 1 0 0 2 1 1 0 0 0-1 1 0 0 1 0 . . .
Codewords (excluding codes for sign): $C_{3D}(0,5,1,0)C_A(9)C_A(5)C_A(3)C_A(1)$  $C_{3D}(1,3,2,0)C_A(1)C_{3D}(2,2,2,0)C_{RL}(2,1,1)$ . . .
Class number: 3
Block size: 16×16 (4n×4n)
Observations about typical such series of quantized coefficients: Non-zero coefficients along the ordering of the series are clustered in the low frequency region and scattered in the high frequency region.
Example additional factors(s) determining the class: Intraframe, high-resolution, complex scene, high bit-rate, low QP.
Predefined coding method(s) for the class: HVLC with HVLC3DPA for the low frequency region and RL_VLC for the high frequency region.
An example sequence: 9-5 3-2 1 0 0 2 1 1 0 0 0-1 1 0 0 0 1 0 . . .
Codewords (excluding codes for sign): $C_{3D}(0,5,1,0)C_A(9)C_A(5)C_A(3)C_A(1)$  $C_{3D}(1,3,2,0)C_A(1)C_{3D}(2,2,2,0)C_{RL}(2,1,1)$ . . .
Class number: 4
Block size: 8×8 (2n×2n)
Observations about typical such series of quantized coefficients: Most non-zero coefficients along the ordering of the series are scattered throughout most of the frequency spectrum.
Example additional factors(s) determining the class: Interframe, low-resolution, simple scene, low bit-rate, high QP.
Predefined coding method(s) for the class: RL_VLC for the entire ordered series, in particular C2DVLC (used in AVS).
An example sequence: 0 0 0 0 1 0 0 2 0 1 0 0 0 -1 0 0 0 1 1 0 . . . (Reverse ordering of the quantized coefficients from high frequency to low frequency)
Codewords (excluding codes for sign): $C_{RL}(4,1,0)C_{RL}(2,2,0)C_{RL}(1,1,0)$ $C_{RL}(3,1,0)C_{RL}(3,1,0)C_{RL}(0,1,1)$
Class number: 5
Block size: 4×4 (n×n)
Observations about typical such series of quantized coefficients: Most non-zero coefficients along the ordering of the series are scattered throughout most of the frequency spectrum.
Example additional factors(s) determining the class: Intraframe, high-resolution, simple scene, low bit-rate, high QP.
Predefined coding method(s) for the class: RL_VLC for the entire ordered series, in particular CAVLC (used in H.264/AVC)

An example sequence: 9-5 0 0 1 0 0 2 0 1 0 0 0 -1 0 0 0 1 1 0 . . . Codewords (excluding codes for sign): $C_{RL}(0,9,0)$ $C_{RL}(0,5,0)C_{RL}(2,1,0)$ $C_{RL}(2,2,0)C_{RL}(1,1,0)C_{RL}(3,1,0)$ $C_{RL}(3,1,0)C_{RL}(0,1,1)$ Decoding While the above descriptions were mostly of coding methods, those skilled in the art will understand that the present description also leads to decoding methods and apparatuses that decode a bitstream that was coded by any of the coding embodiments described herein. The decoding method includes accepting a bitstream including codewords encoded by the coding method described above, including recognizing codewords in the bitstream and decoding the codewords. The codewords are decoded using VLC mappings, e.g., VLC tables. Furthermore, the decoding method includes the classification of the codewords of blocks into the corresponding classes or recognizing included codes for the class, so that the decoding is for the pre-defined coding method for the class.

For context adaptive VLC methods, the VLC tables for decoding are selected according to one or more context-based selection criteria as used in the coding. Because any decoded item of information can be used by a coder in the decoding process, during decoding of a codeword, any context-based selection criterion is known or derivable from one or more previously decoded items of information. For example, any table switching uses information of previously decoded coefficients, e.g., of block(s) adjacent to the blocks being coded, and/or previously decoded coefficients within the block being decoded, which VLC table was used for a particular codeword is included in the decoding method according to the same criterion as would be used by an encoding method.

In the case the pre-defined coding method for a class is a hybrid method, such that the series includes a first (low frequency) region and one or more other regions, the coding method includes coding all regions. The decoding method includes decoding those of the codewords that are of all regions.

Apparatus Embodiments

Particular embodiments include an apparatus embodiment comprising a classifier configured to accept an ordered series of quantized transform coefficients of a block of image data and to classify the accepted series into a class of a plurality of pre-defined classes according to one or more factors including the size of the block of image data. The apparatus embodiment further comprises an entropy encoder coupled to the classifier and configured to accept the ordered series and apply one of a plurality of pre-defined entropy coding method to the accepted ordered series to form a sequence of codewords. The entropy coding method applied us according to the class of the accepted series. As in the method embodiments, for at least two different pre-defined classes of ordered series of different sizes, different pre-defined entropy coding methods are applied to the different pre-defined classes.

In the case that one of the pre-defined coding methods include a context adaptive HVLC (CAHVLC) method, the encoder including a joint encoder configured to encode in a first region of the series, which for some classes may be the whole series, joint position and amplitude events that each are defined by a cluster of consecutive non-zero-valued coefficients, each event defined by three parameters: the number of zero-valued coefficients preceding the cluster, the number of non-zero-valued coefficients in the cluster, and a third parameter indicative of the number of trailing non-zero-valued coefficients that have amplitude 1 in the cluster, with the coding according to a 3-dimensional joint VLC table. In some embodiments, for a cluster length of 2, the third parameter indicates which of the two quantized coefficients has amplitude 1. In some embodiments, for a cluster length of one, the third parameter indicates value of the non-zero amplitude. The encoder for encoding CAHVLC further includes an amplitude encoder configured to encode the non-zero-valued coefficients that were not encoded by the joint encoding, e.g., encoding other than the amplitude 1 trailing coefficients. Such amplitudes include the next most likely-to-occur amplitude to amplitude 1, which is amplitude 2. In some embodiments, the coefficient amplitude encoder uses a 1-D VLC for each value indicative of the amplitude. One embodiment separately encodes the non-zero-valued coefficients other than that adjacent to the trailing amplitude 1 coefficients, then encodes a value, the (amplitude value minus 1) of the adjacent non-zero coefficient since that coefficient has amplitude greater than 1.

In the case that one of the pre-defined coding methods include a context adaptive HVLC (CAHVLC) method with quantization modification, encoder includes a quantization modifier that is configured to locally modify the quantization generated by a quantizer to decrease the number of events that need to be coded and to reduce the coded bitstream length, the locally modifying including one or more quantization modification methods.

The apparatus further includes a sign encoder configured to encode the sign of the non-zero-valued coefficients.

One embodiment of the encoder that encodes using a hybrid variable length coding method is configured to encode, in the case there are two or more regions defines for the ordered series, the coefficients of the remaining regions.

The encoder further includes a concatenator configured to concatenate the resulting codewords.

Figure 9:
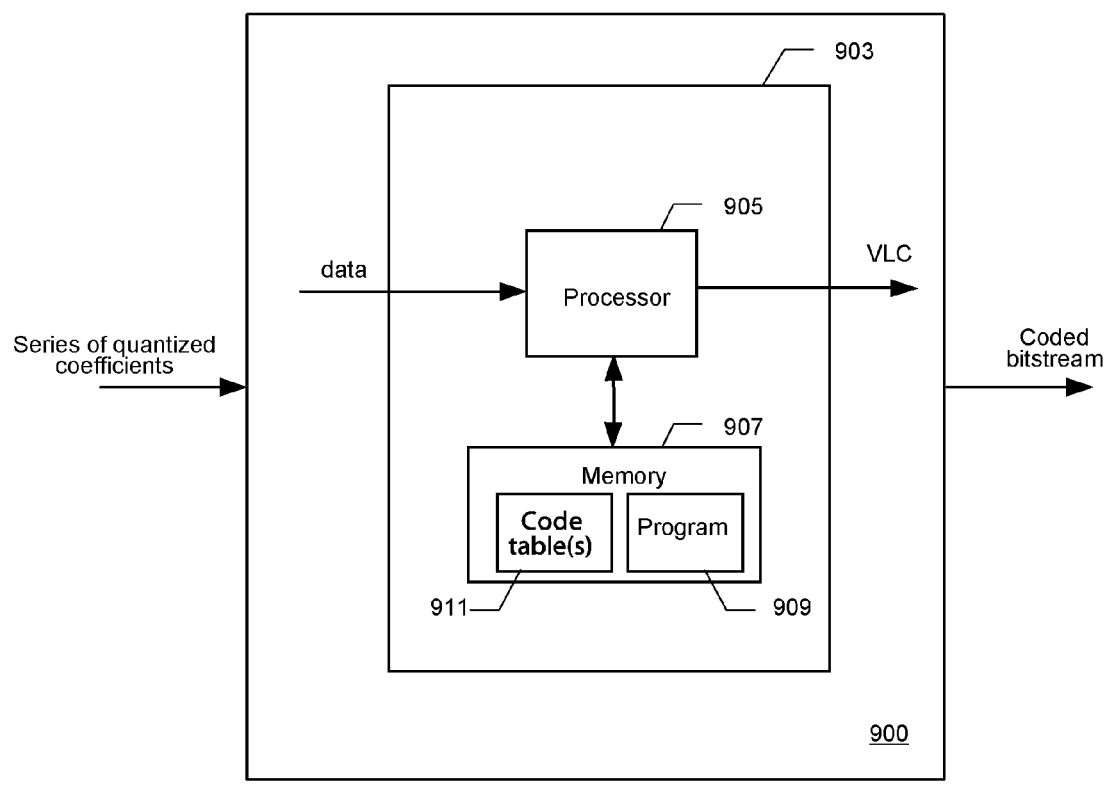
FIG. 9 shows a simplified block diagram in accordance with an embodiment of the present invention that includes an apparatus that is configured to implement a coding method as described herein.

FIG. 9 shows an embodiment that includes an apparatus 900 that is configured to implement a coding method as described herein, e.g., as described in FIG. 1. Apparatus 1100 includes processing system 1103 that includes one or more processors 1105 and a memory 1107. The apparatus is configured to accept an ordered series of quantized transform coefficients, quantized by a fixed quantization method. A single processor is shown in FIG. 9 and those skilled in the art will appreciate that this may represent several processors. Similarly, a single memory subsystem 907 is shown, and those skilled in the art will appreciate that the memory subsystem may include different elements such as RAM, ROM, and so forth. In addition, the memory subsystem is meant to include any non-volatile memory storage such as a magnetic or optical storage component. A computer program 909 is included and is loaded into the memory 907. Note that at any time, some of the programs may be in the different parts of the memory subsystem, as will be understood by those skilled in the art. The program 907 includes instructions to instruct the processor to implement a classifier and, in different versions, the respective different coding methods including for the respective different pre-defined classes of blocks, e.g., as described herein. In the embodiment shown, the method uses one or more coding tables 911 in the memory subsystem 907.

Figure 10:
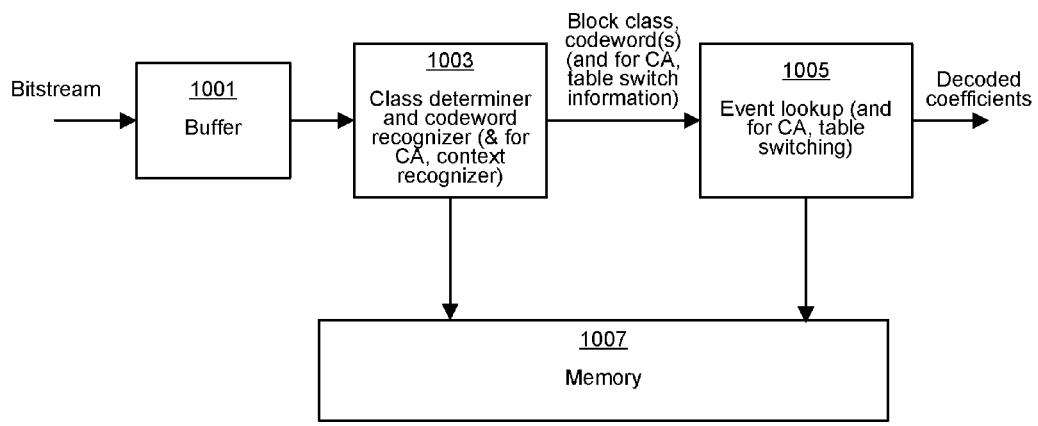
FIG. 10 shows a simplified block diagram in accordance with an embodiment of the present invention that includes a decoder configured to decode a bitstream encoded by a pre-defined coding method.

FIG. 10 shows one embodiment of a decoder configured to decode a bitstream encoded by a pre-defined coding method. The apparatus includes an input buffer 1001 that is configured to accept a bitstream encoded by a compression method that includes any of the coding method embodiments described herein.

The output of the buffer acts as input to a class determiner and codeword recognizer 1003. Element 1003 includes a class determiner 1003 and in the case of context based coding context determiner. The class determiner 1003 accepts the bits of the input bitstream and that is configured to determine which of the coding methods are used, hence how to recognize codewords, determine codewords, and which coding tables to use to lookup each codeword. A decoder 1005 is coupled to the codeword recognizer and class determiner 1003 and is configured to determine the data for the codeword recognized by the codeword recognizer for the class of block, including, for any of the position coding methods described herein, a codeword recognizer that can ascertain the position of the non-zero or zero valued coefficients, depending on the position coding used. The class determiner and codeword recognizer also recognizes other codewords that encode other parameters encoded by the coding method, including the non-zero values, an indication of the number of trailing coefficients, and so forth, depending on the class of the block and corresponding coding method. The class determiner and codeword recognizer 1003 also provides information to enable a decoder 1005 to determine which code table, used as a decoding table to use. In some embodiments, the decoder 1005 includes a lookup device that looks up the appropriate decoding table stored in a memory 1007. That table provides the event for at least some of the codewords of the sequence of codewords. Other codewords may include an "escape" code, so that decoding is by other than a table lookup method.

While in the embodiment shown in FIG. 10, the memory is shown separate from the lookup device (decoder) 1005, those skilled in the art will understand that in other embodiments, the lookup device 1005 includes memory for the tables, and such other embodiments are included herein.

Figure 11:
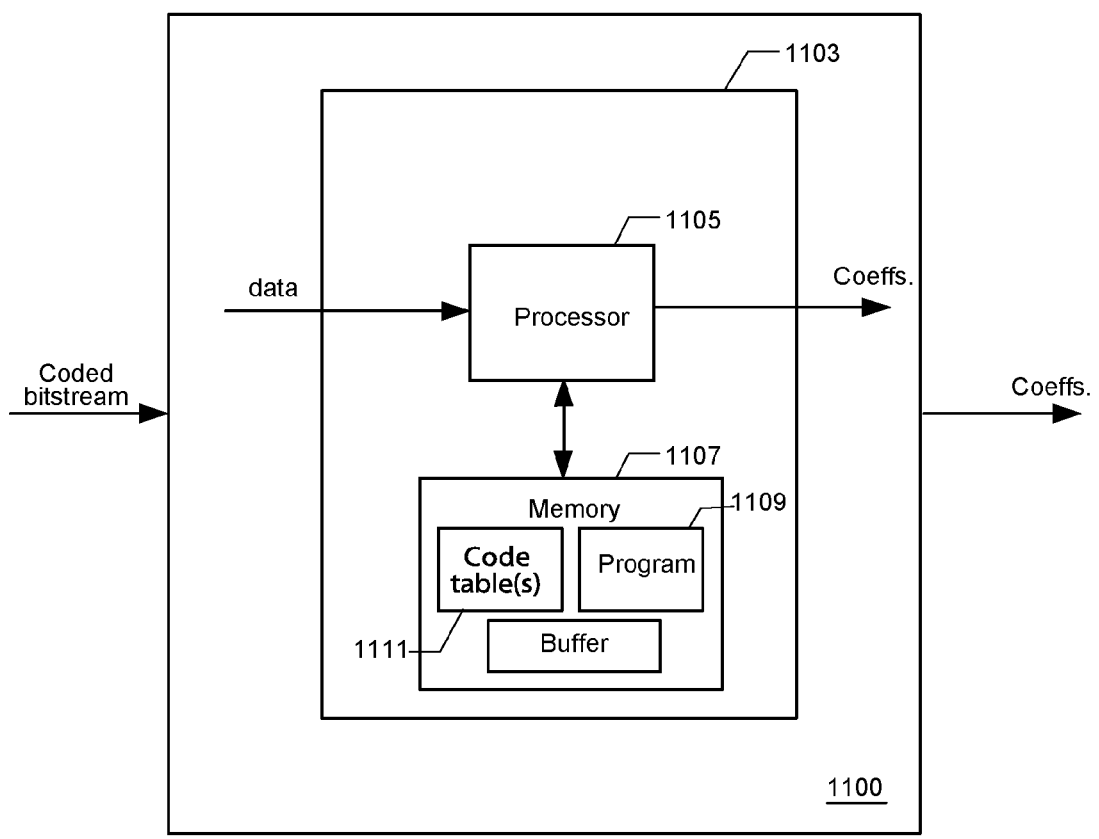
FIG. 11 shows another a simplified block diagram in accordance with an embodiment of the present invention that includes that includes an apparatus configured to implement a decoder of a coding method described herein

FIG. 11 shows another embodiment that includes an apparatus 1300 configured to implement a decoder of a variable length coding method described herein. Decoding apparatus 1100 includes a processing system 1103 that includes one or more processors 1105 and a memory 1107. A single processor is shown in FIG. 11 and those skilled in the art will appreciate that this may represent several processors. Similarly, a single memory subsystem 1307 is shown, and those skilled in the art will appreciate that the memory subsystem may include different elements such as RAM, ROM, and so forth. In addition, the memory subsystem is meant to include any non-volatile memory storage such as a magnetic or optical storage component. A computer program 1109 is included and is loaded into the memory 1107. Note that at any time, some of the programs may be in the different parts of the memory subsystem, as will be understood by those skilled in the art. The program 1109 includes instructions to instruct the processor to implement, in different versions, the recognizing of block class, the recognizing of codewords, and decoding of codewords. In the embodiment shown, the decoding method uses one or more coding tables 1111 in the memory subsystem 1107. Part of the memory subsystem may also serve as a buffer for incoming bitstream that includes codewords to be decoded.

Other embodiments

Other embodiments include logic encoded in one or more tangible computer-readable storage media, the logic being for execution and when executed causing carrying out any one of the coding methods described herein. How to implement such logic would be clear to one skilled in the art from the description herein.

Other embodiments include logic encoded in one or more tangible computer-readable storage media for execution and when executed operative to carry out any of the decoding methods described herein. How to implement such logic would be clear to one skilled in the art from the description herein.

Other embodiments include a computer-readable storage medium having a set of instructions encoded thereon that when executed by one or more processors of a processing system cause carrying out any of the coding methods described herein.

Other embodiments include a computer-readable storage medium having a set of instructions coded thereon that when executed by one or more processors of a processing system cause carrying out any of the decoding methods described herein.

Other Observations

The term "series" as used herein for the series of quantized coefficients is sometimes referred to as a "block" of coefficients, and also as a "series" of coefficients. Sometimes the term sequence of coefficients is used. Those skilled in the art will understand that such terms may be interchangeably used and the meaning would be clear to those skilled in the art from the context.

Also, in the description, it is assumed that the series includes only the AC coefficients and that the DC coefficient of the transform of the block is separately encoded. How to modify the methods described herein to include the DC coefficient would be clear to those skilled in the art.

Furthermore, in the description of example embodiments it was assumed that the quantization of coefficients is such that zero is the most likely to occur quantized amplitude, and 1 is the next most likely to occur quantized amplitude. Of course it is possible to quantize in a manner so that other values or events are used for the most likely-to-occur quantized value or values, and different other values or events are used for the next most likely-to-occur quantized value or values. Those skilled in the art will understand how to modify the particular methods described herein to accommodate such variations, and such variations are additional embodiments of the present invention.

Furthermore, embodiments of the present invention are not limited to any one type of architecture or type of transform encoding, or to transform coding that conforms to a standard.

Furthermore, while the example embodiments included classifying series into one of a number of pre-defined classes, and mapping a pre-defined entropy coding method to each class, other embodiments of the present invention are not limited to the VLC methods described herein, or to the number of classes in the examples provided herein, or to the block sizes of the examples provided herein.

As an example, context adaptive Hybrid Variable Length Coding with locally variable quantization CAHVLC(LV) may be used for some larger blocks. Some of CAHVLC's efficiency comes from its joint coding nature, e.g., representing the respective run-lengths of zero and non-zero coefficients together with trailing-1's as a 3-tuple and coding it by higher-dimensional variable length coding, and using adaptive code table switching for both position coding and amplitude coding. The coding efficiency may be further improved if fewer coding (3DPA and 1DA) events can be used to represent the entire transform coefficient series and/or if the coding events for each block could match the code table switch trend better by eliminating the local variations of the coding events in each block of a picture. CAHVLC(LV) includes locally varying the quantization according to local conditions in order to reduce the number of coding events needed to represent the series of transform coefficients and/or matches the coding events with the code table switch tread while keeps the introduced distortion relatively small. For example, one or more of the following quantization modifications can be included:

(1) In the case of an isolated small non-zero coefficient, say amplitude 1, is preceded and followed by a series of zeroes, in which case the isolated small non-zero coefficient is quantized to zero so that a single 3DPA event can represent a much longer series of coefficients. The magnitude the non-zero coefficient is small, e.g., 1, typically introducing only small distortion introduced by quantizing the coefficient to zero.

(2) In the case that an isolated zero coefficient is preceded and followed by a series of non-zero coefficients, the isolated zero coefficient is quantized to a non-zero value, e.g., 1, such that it can be coded by one 3DPA event without introducing notable distortion.

(3) In the case that a pair of small coefficients (0 1) is preceded by a series of non-zero coefficients and followed by a series of zero coefficients, for example ( . . . 8 5 3 2 1 0 1 0 0 0 5 3 1 0 0 0 0 . . . ), which requires three 3DPA events to encode, one or two ways are used to reduce the number of code events by replacing (0 1) with either (0 0) or (1 1).

(4) In the case that a pair of small coefficients (1 0) is preceded by a series of zero coefficients and followed by a series of non-zero coefficients, for example ( . . . 8 5 3 2 1 0 0 0 1 0 5 3 1 0 0 0 0 . . . ), which requires three 3DPA events to encode, one of two ways to reduce the number of code events is used: replacing (1 0) with either (0 0) or (1 1).

(5) In the case that a small non-zero, non-amplitude 1 coefficient, e.g., an amplitude 2 coefficient, is preceded and followed by a series of amplitude 1 coefficients. The amplitude 2 coefficient is quantized to have amplitude 1, such that more coefficients can be encoded by the number of trailing amplitude 1 coefficients ($T_1$), so that fewer coefficients need to be encoded by the additional 1DA coding. By modifying one small coefficient, the number of coding events is reduced.

The present disclosure does not depend on any particular type of interframe coding if used, or of motion compensation if used for interframe coding, or any intraframe estimation if used for estimating the pixels of a block using information from neighbouring blocks.

Note that variable length coding is sometimes referred to as entropy coding or statistical coding.

Note that the terms coding and encoding are used interchangeably herein.

Note that the term series means an ordered series of quantized transform coefficients, unless otherwise indicated.

Note that amplitude means the amplitude after quantization unless indicated otherwise herein.

Note also that zero-valued, and non-zero valued refer to values of amplitudes after quantization according to a quantization method such that zero is the most likely to occur quantized amplitude, and 1 is the next most-likely to occur quantized amplitude. Similarly, where the values of coefficients are referred to, it is to be understood the term refers to the quantized values unless it is otherwise indicated or clear from the circumstance.

In some of the embodiments described above, no sign data was included. Most transforms produce positive and negative coefficients, and the forming of the codeword includes an indication of the sign of any non-zero-valued quantized coefficients. In one version, the sign information for any runs of non-zero amplitudes in any region is added together with the information of each amplitude. In an alternate embodiment, the sign information for any runs of non-zero amplitudes in any region may be included in a different manner, e.g., as a code for the series of signs. Other alternate embodiments are also possible for encoding the sign. Those skilled in the art will understand that embodiments of the present invention are not limited to any particular mechanism for including sign information.

Note that in some examples for amplitude encoding, a different number of possible non-zero values can be assumed for the coefficients. Embodiments of the present invention however are not restricted to any number of possible quantization values.

Note also that the term amplitude is irrespective of sign. Therefore, for example, coefficient of values +1 and −1 both have amplitude 1.

While one embodiment described herein includes a memory that stores coding tables, other embodiments store the coding information in the form of a data structure other than a table, e.g., a structure that includes a tree. Other data structures may also be used. Similarly, while one embodiment described herein includes a memory that stores a decoding, other embodiments store the decoding information in the form of a data structure other than a table for the decoding.

Note also that the present disclosure does not depend on the particular type of variable length coding used for any of the coding methods, e.g., the coding tables, and can work, for example, with Huffman coding and with arithmetic coding methods. Furthermore, while embodiments have been described that use fixed encoding for the events based on assumed or a priori likelihoods of occurrence of the events (also called the events), i.e., the likelihoods of occurrence of the events do not change, other embodiments use adaptive encoding, i.e., the encoding is changeable according to statistical data such as histograms collected from the actual coefficients.

Unless specifically stated otherwise, as apparent from the following discussions, it is appreciated that throughout the specification discussions using terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps, is implied, unless specifically stated.

The methodologies described herein are, in some embodiments, performable by one or more processors that accept logic, e.g., instructions encoded on one or more computer-readable storage media. When executed by one or more of the processors, the instructions cause carrying out at least one of the methods described herein. Any processor capable of executing a set of instructions (sequential or otherwise) that specify actions to be taken are included. Thus, one example is a typical processing system that includes one or more processors. Each processor may include one or more of a CPU or similar element, a graphics processing unit (GPU), and/or a programmable DSP unit. The processing system further includes a storage subsystem with at least one storage medium, which may include memory embedded in a semiconductor device, or a separate memory subsystem including main RAM and/or a static RAM, and/or ROM, and also cache memory. The storage subsystem may further include one or more other storage devices, such as magnetic and/or optical and/or further solid state storage devices. A bus subsystem may be included for communicating between the components. The processing system further may be a distributed processing system with processors coupled by a network, e.g., via network interface devices or wireless network interface devices. If the processing system requires a display, such a display may be included, e.g., a liquid crystal display (LCD), organic light emitting display (OLED), or a cathode ray tube (CRT) display. If manual data entry is required, the processing system also includes an input device such as one or more of an alphanumeric input unit such as a keyboard, a pointing control device such as a mouse, and so forth. The term storage device, storage subsystem, or memory unit as used herein, if clear from the context and unless explicitly stated otherwise, also encompasses a storage system such as a disk drive unit. The processing system in some configurations may include a sound output device, and a network interface device.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The term processing system encompasses all such possibilities, unless explicitly excluded herein. The one or more processors may form a personal computer (PC), a media playback device, a tablet PC, a set-top box (STB), a Personal Digital Assistant (PDA), a game machine, a cellular telephone, a Web appliance, a network router, switch or bridge, or any machine capable of executing a set of instructions (sequential or otherwise) that specify actions to be taken by that machine.

Note that while some diagram(s) only show(s) a single processor and a single storage subsystem, e.g., a single memory that stores the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

While a computer readable medium may be shown in an example embodiment to be a single medium, the term "medium" should be taken to include a single medium or multiple media (e.g., several memories, a centralized or distributed database, one or more servers, and so forth) that store the one or more sets of instructions. A computer readable storage medium may take many forms, including but not limited to a solid state memory, optical memory such as an optical disk, a magnetic memory, such as a magnetic disk, and magneto-optical disks.

It will also be understood that embodiments of the present invention are not limited to any particular implementation or programming technique and that such embodiments may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill skilled in the art from this disclosure, in one or more embodiments.

Similarly it should be appreciated that in the above description of example embodiments of the present invention, various features of the present invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own.

Furthermore, while some embodiments described herein include some but not other features included in other embodiments, combinations of features of two or more embodiments form different embodiments of the present invention, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element.

In the description provided herein, numerous specific details are set forth.

However, it is understood that embodiments of the present invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patents, U.S. patent applications, and International (PCT) patent applications designating the United States cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the example embodiments of the present invention, those skilled in the art will recognize that other and further modifications may be made thereto without departing from the spirit of the present invention, and it is intended that all such changes and modifications fall within the scope of the appended claims. For example, any formulas given above are merely representative of procedures that may be used, functionality may be added or deleted from the block diagrams, operations may be interchanged among functional blocks, and steps may be added or deleted to methods described within the scope of the present invention.

We claim:

1. A method of processing, comprising:
   accepting an ordered series of quantized transform coefficients of a block of image data, the quantized transform coefficients being generated according to a quantization parameter of the block;
   classifying the accepted series to form a classified series having a class of a plurality of pre-defined classes, the classifying being according to one or more factors including the size of the block of image data, the classifying comprising:
      first-stage classifying the accepted series to form a first-stage classified series having a first class of a plurality of pre-defined first classes, the first-stage classifying being according to the size of the block; and
      second-stage classifying the first-stage classified series to form the classified series having the first class and further having a second class of one or more second classes pre-defined for the first class, the second-stage classifying being according to one or more factors including the quantization parameter of the block, such that the class of the accepted series is defined by at least the first class and the second class; and
   applying one of a plurality of pre-defined entropy coding methods to the accepted ordered series to form a sequence of codewords, the entropy coding method applied being according to the class of the accepted series,
   wherein for at least two different pre-defined classes of ordered series of different sizes, different pre-defined entropy coding methods are applied to the different pre-defined classes.

2. The method of claim 1, wherein the plurality of pre-defined first classes is a corresponding plurality of pre-defined block sizes, such that each block size of the plurality has one or more pre-defined second classes and one or more associated entropy coding methods, wherein the first-stage classifying includes classifying the series into a series-block size of the plurality of pre-defined block sizes according to the size of the series, wherein the second stage classifying classifies into one of the one or more second classes pre-defined for the series-block size, and wherein applying one of a plurality of pre-defined entropy coding methods applies the pre-defined entropy coding method for the one pre-defined second class for the series-block size of the series.

3. The method of claim 1, further comprising forming a bitstream for a set of blocks of a picture or sequence of pictures, the bitstream including the codewords formed for the series of the set of blocks, and an indication of factors sufficient for a decoder to ascertain the size of each block, the class for the size of the block of any formed sequence of codewords, and the entropy coding method applied to the block.

4. The method of claim 1, further comprising adding a code to the codewords for the series to indicate to a decoder the class of the block.

5. The method of claim 1, wherein at least some of the pre-defined coding methods are variable length coding (VLC) methods.

6. The method of claim 1,
   wherein the quantized coefficients can have amplitudes including a most-likely-to occur amplitude and at least a next-to-most likely to occur amplitude,
   wherein at least one of the pre-defined coding methods are VLC methods including at least one hybrid VLC method (HVLC), each HVLC method including for a low frequency region of the series, which may be the whole series, coding the position of clusters of consecutive coefficients having other than the most-likely-to occur amplitude, and coding for the clusters the amplitudes of the coefficients having other than the most-likely-to occur amplitude.

7. The method of claim 6,
   wherein at least one low frequency region VLC method is a low frequency VLC method of a Context Adaptive Position and Amplitude Coding (CAPAC) method according to which positions of clusters of coefficients having other than the most-likely-to-occur amplitudes are ordered and coded by multiple VLC mappings with adaptive table switching based on one or more items of information determinable from previously encoded information.

8. The method of claim 6,
   wherein at least one low frequency region VLC method is a low frequency VLC method of a hybrid VLC with three-dimensional coding of events (HVLC3DPA method), events being defined by the number of consecutive coefficients having the most-likely-to-occur amplitude precede each cluster of non-zeroes, the run-length of each cluster of consecutive coefficients having other than the most-likely-to-occur amplitude, and a parameter that indicates the number of trailing coefficients having the next-to-most likely to occur amplitude, any remaining amplitudes being coded by a one-dimensional VLC mapping.

9. The method of claim 6,
wherein at least one low frequency region VLC method is a low frequency VLC method of a Context Adaptive Hybrid Variable Length Coding (CAHVLC) method.

10. The method of claim 1,
wherein the quantized coefficients can have amplitudes including a most-likely-to occur amplitude and at least a next-to-most likely to occur amplitude,
wherein at least one of the pre-defined entropy coding methods is a HVLC method that includes partitioning the series into a low frequency region, possibly the whole series, and a high frequency region, possibly the whole series, wherein the low frequency region is coded by a low frequency VLC method, and the high frequency region is coded by a high frequency VLC method, the low frequency VLC method including for the low frequency region of the series, which may be the whole series, coding the position of clusters of consecutive coefficients having other than the most-likely-to occur amplitude, and coding for the clusters the amplitudes of the coefficients having other than the most-likely-to occur amplitude, and the high frequency VLC method including for the high frequency region, which may be the whole series, run-level VLC that jointly codes a run length, possibly of zero, of quantized coefficients having the most likely-to-occur amplitude and the amplitude level of a single immediately following quantized coefficient having other than the most likely-to-occur amplitude.

11. The method of claim 10,
wherein at least one low frequency region VLC method is a low frequency VLC method of a CAPAC method according to which positions of clusters of coefficients having other than the most-likely-to-occur amplitudes are ordered and coded by multiple VLC mappings with adaptive table switching based on one or more items of information determinable from previously encoded information.

12. The method of claim 10,
wherein at least one low frequency region VLC method is a low frequency VLC method of a HVLC3DPA in which events are defined by the number of consecutive coefficients having the most-likely-to-occur amplitude precede each cluster of non-zeroes, the run-length of each cluster of consecutive coefficients having other than the most-likely-to-occur amplitude, and a parameter that indicates the number of trailing coefficients having the next-to-most likely to occur amplitude, and jointly coded, any remaining amplitudes being coded by a one-dimensional VLC mapping.

13. The method of claim 10,
wherein at least one low frequency region VLC method is a low frequency VLC method of a CAHVLC method.

14. The method of claim 1,
wherein one of the block sizes is ×4 and wherein the pre-defined entropy coding method for the 4×4 block size is an entropy method defined for 4×4 blocks by the H.264/AVC standard.

15. The method of claim 1,
wherein one of the block sizes is 8×8 and wherein the pre-defined entropy coding method for the 8×8 block size is an entropy method defined for 8×8 blocks by the AVS standard of China.

16. The method of claim 1,
wherein the block sizes include 32×32, 16×16, 8×8, and 4×4.

17. An apparatus comprising:
a classifier configured to accept an ordered series of quantized transform coefficients of a block of image data, the quantized transform coefficients being generated according to a quantization parameter of the block, and to classify the accepted series to form a classified series having a class of a plurality of pre-defined classes, the classifying according to one or more factors including the size of the block of image data, the classifier comprising:
a first-stage classifier configured to classify the accepted series to form a first-stage classified series having a first class of a plurality of pre-defined first classes, the first-stage classifier's classifying according to the size of the block, and
a second-stage classifier configured to classify the first-stage classified series to form the classified series having the first class and further having a second class of one or more second classes pre-defined for the first class determined by the first-stage classifier, the second-stage classifier's classifying being according to one or more factors including the quantization parameter of the block, such that the class of the accepted series is defined by at least the first class and the second class; and
an entropy encoder coupled to the classifier and configured to accept the ordered series and apply one of a plurality of pre-defined entropy coding methods to the accepted ordered series to form a sequence of codewords, the entropy coding method applied being according to the class of the accepted series,
wherein for at least two different pre-defined classes of ordered series of different sizes, different pre-defined entropy coding methods are applied to the different pre-defined classes.

18. The apparatus of claim 17,
wherein the quantized coefficients can have amplitudes including a most-likely-to occur amplitude and at least a next-to-most likely to occur amplitude,
wherein at least some of the pre-defined coding methods are VLC methods including at least one hybrid VLC method (HVLC), each HVLC method including for a low frequency region of the series, which may be the whole series, coding the position of clusters of consecutive coefficients having other than the most-likely-to occur amplitude, and coding for the clusters the amplitudes of the coefficients having other than the most-likely-to occur amplitude.

19. The apparatus of claim 18,
wherein at least one low frequency region VLC method is a low frequency VLC method of at least one of a CAPAC method, a HVLC3DPA method, and a CAHVLC method.

20. The apparatus of claim 17,
wherein the quantized coefficients can have amplitudes including a most-likely-to occur amplitude and at least a next-to-most likely to occur amplitude,
wherein at least one of the pre-defined entropy coding methods is a HVLC method that includes partitioning the series into a low frequency region, possibly the whole series, and a high frequency region, possibly the whole series, wherein the low frequency region is coded by a low frequency VLC method, and the high frequency region is coded by a high frequency VLC method, the low frequency VLC method including for the low frequency region of the series, which may be the whole series, coding the position of clusters of consecutive coefficients having other than the most-likely-to occur amplitude, and coding for the clusters the amplitudes of the coefficients having other than the most-likely-to occur amplitude, and the high frequency VLC method including for the high frequency region, which may be the whole series, run-level VLC that jointly codes a run length, possibly of zero, of quantized coefficients having the most likely-to-occur amplitude and the amplitude level of a single immediately following quantized coefficient having other than the most likely-to-occur amplitude.

21. The apparatus of claim 20,
wherein at least one low frequency region VLC method is a low frequency VLC method of at least one of a CAPAC method, a HVLC3DPA method, and a CAHVLC method.

22. The apparatus of claim 17,
wherein one of the block sizes is 4×4, wherein the pre-defined entropy coding method for the 4×4 block size is an entropy method defined for 4×4 blocks by the H.264/AVC standard, wherein one of the block sizes is 8×8, and wherein the pre-defined entropy coding method for the 8×8 block size is an entropy method defined for 8×8 blocks by the AVS standard of China.

23. The apparatus of claim 17,
wherein the block sizes include 32×32, 16×16, 8×8, and 4×4.

24. A non-transitory computer-readable medium configured with instructions that when executed by one or more processors of a processing system cause carrying out of a method comprising:
  accepting an ordered series of quantized transform coefficients of a block of image data, the quantized transform coefficients being generated according to a quantization parameter of the block;
  classifying the accepted series to form a classified series having a class of a plurality of pre-defined classes, the classifying being according to one or more factors including the size of the block of image data, the classifying comprising:
    first-stage classifying the accepted series to form a first-stage classified series having a first class of a plurality of pre-defined first classes, the first-stage classifying being according to the size of the block; and
    second-stage classifying the first-stage classified series to form the classified series having the first class and further having a second class of one or more second classes pre-defined for the first class determined by the first-stage classifying, the second-stage classifying being according to one or more factors including the quantization parameter of the block, such that the class of the accepted series is defined by at least the first class and the second class; and
  applying one of a plurality of pre-defined entropy coding methods to the accepted ordered series to form a sequence of codewords, the entropy coding method applied being according to the class of the accepted series,
  wherein for at least two different pre-defined classes of ordered series of different sizes, different pre-defined entropy coding methods are applied to the different pre-defined classes.

* * * * *